US012593542B2

(12) United States Patent
Yoon

(10) Patent No.: US 12,593,542 B2
(45) Date of Patent: Mar. 31, 2026

(54) DISPLAY DEVICE

(71) Applicant: Samsung Display Co., LTD., Yongin-si (KR)

(72) Inventor: Hyung Guen Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 920 days.

(21) Appl. No.: 17/862,978

(22) Filed: Jul. 12, 2022

(65) Prior Publication Data

US 2023/0163258 A1 May 25, 2023

(30) Foreign Application Priority Data

Nov. 24, 2021 (KR) .......................... 10-2021-0163496

(51) Int. Cl.
H10H 20/851 (2025.01)
H10H 29/14 (2025.01)

(52) U.S. Cl.
CPC ...... H10H 20/8514 (2025.01); H10H 29/142 (2025.01)

(58) Field of Classification Search
None
See application file for complete search history.

(56) References Cited

U.S. PATENT DOCUMENTS

| | | | |
|---|---|---|---|
| 10,825,966 B2 | 11/2020 | Wang et al. | |
| 11,042,059 B2 | 6/2021 | Lee et al. | |
| 12,329,012 B2 | 6/2025 | Ahn et al. | |
| 2011/0198629 A1* | 8/2011 | Lee ...................... | H10K 50/852 |
| | | | 257/89 |
| 2017/0092820 A1* | 3/2017 | Kim ..................... | H10H 20/825 |

FOREIGN PATENT DOCUMENTS

| | | |
|---|---|---|
| KR | 10-2015-0118502 A | 10/2015 |
| KR | 10-2021-0082291 A | 7/2021 |

* cited by examiner

*Primary Examiner* — Bo B Jang
(74) *Attorney, Agent, or Firm* — Womble Bond Dickinson (US) LLP

(57) ABSTRACT

A display device includes light emitting elements disposed in pixels; a color conversion layer disposed on the light emitting elements; a color filter layer disposed on the color conversion layer; and a resonant filter disposed between the color conversion layer and the color filter layer. The resonant filter includes a first semi-transmissive layer, a second semi-transmissive layer, and a medium disposed between the first semi-transmissive layer and the second semi-transmissive layer.

20 Claims, 13 Drawing Sheets

PXL

OPA2    NEA    EA    NEA    OPA2

BNK ALE1    ELT1 EP1    INS2    EP2    ELT2 ALE2    BNK

LEL

GI    CH1    CH2    INS1

LD (LD1)    VIA

PCL    PSV    ILD    BFL    BSL

B    B'

TE2 GE SCP BML TE1    BNP1    BNP2    PL2b GI PL2a PL2c

M(M1)

Z
↑
Y → X

DISPLAY DEVICE

CROSS-REFERENCE TO RELATED APPLICATION(S)

The present application claims priority to and benefits of Korean patent application 10-2021-0163496 under 35 U.S.C. § 119(a), filed on Nov. 24, 2021, in the Korean Intellectual Property Office (KIPO), the entire contents of which are incorporated herein by reference.

BACKGROUND

1. Technical Field

The disclosure generally relates to a display device.

2. Description of Related Art

Recently, as interest in information displays is increased, research and development of display devices have been continuously conducted.

SUMMARY

Embodiments provide a display device capable of improving light efficiency and luminance.

In accordance with an aspect of the disclosure, there is provided a display device including light emitting elements disposed in pixels; a color conversion layer disposed on the light emitting elements; a color filter layer disposed on the color conversion layer; and a resonant filter disposed between the color conversion layer and the color filter layer, wherein the resonant filter includes a first semi-transmissive layer, a second semi-transmissive layer, and a medium disposed between the first semi-transmissive layer and the second semi-transmissive layer.

The pixels may include a first pixel, a second pixel, and a third pixel. The resonant filter may include a first resonant filter disposed in the first pixel; and a second resonant filter disposed in the second pixel.

The first resonant filter and/or the second resonant filter may not overlap the third pixel in a plan view.

The resonant filter may further include a third resonant filter overlapping the third pixel in a plan view.

A thickness of a medium of the first resonant filter may be different from a thickness of a medium of the second resonant filter.

A thickness of a medium of the first resonant filter may be equal to a thickness of a medium of the second resonant filter.

The pixels may include a first pixel emitting light of a first color; a second pixel emitting light of a second color; and a third pixel emitting light of a third color. The resonant filter may allow the lights of the first to third colors to be selectively reflected therefrom or transmitted therethrough.

The resonant filter may allow about 70% or more of the light of the first color and/or the light of the second color to be transmitted therethrough, and allow about 20% or less of the light of the third color to be transmitted therethrough.

The resonant filter may allow about 10% or less of the light of the first color and/or the light of the second color to be reflected therefrom, and allow about 60% or more of the light of the third color to be reflected therefrom.

The medium of the resonant filter may have a refractive index of about 2.5 or less.

The first semi-transmissive layer and/or the second semi-transmissive layer may be a metal thin film.

In accordance with another aspect of the disclosure, there is provided a display device including first to third pixels respectively emitting light of first to third colors; light emitting elements disposed in the first to third pixels; a color conversion layer disposed on the light emitting elements; a color filter layer disposed on the color conversion layer; a first resonant filter disposed in the first pixel between the color conversion layer and the color filter layer; and a second resonant filter disposed in the second pixel between the color conversion layer and the color filter layer.

The first resonant filter and/or the second resonant filter may allow the lights of the first to third colors to be selectively reflected therefrom or transmitted therethrough.

The first resonant filter and/or the second resonant filter may not overlap the third pixel.

The display device may further include a third resonant filter disposed in the third pixel between the color conversion layer and the color filter layer.

A thickness of the first resonant filter may be different from a thickness of the second resonant filter.

A thickness of the first resonant filter may be equal to a thickness of the second resonant filter.

The color conversion layer may include a first color conversion layer disposed in the first pixel; a second color conversion layer disposed in the second pixel; and a light scattering layer disposed in the third pixel.

The light emitting elements may emit the light of the third color.

Each of the light emitting elements may include a first semiconductor layer, a second semiconductor layer, and an active layer disposed between the first semiconductor layer and the second semiconductor layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be more thorough and complete, and will convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
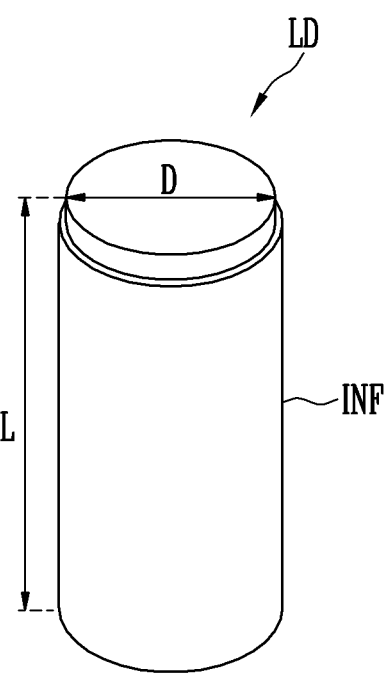
FIG. 1 is a schematic perspective view illustrating a light emitting element in accordance with an embodiment of the disclosure.

The effects and characteristics of the disclosure and a method of achieving the effects and characteristics will be clear by referring to the embodiments described below in detail together with the accompanying drawings. However, the disclosure is not limited to the embodiments disclosed herein but may be implemented in various forms. The embodiments are provided by way of example only so that a person of ordinary skilled in the art can understand the features in the disclosure and the scope thereof. Therefore, the disclosure can be defined by the scope of the appended claims.

The terminology used herein is for the purpose of describing particular embodiments only and is not construed as limiting the disclosure. As used herein, the singular forms are intended to include the plural forms (or meanings) as well, unless the context clearly indicates otherwise. The terms "comprises/includes" and/or "comprising/including," when used in this specification, specify the presence of mentioned component, step, operation and/or element, but do not exclude the presence or addition of one or more other components, steps, operations and/or elements.

When described as that any element is "connected", "coupled" or "accessed" to another element, it should be understood that it is possible that still another element may "connected", "coupled" or "accessed" between the two elements as well as that the two elements are directly "connected", "coupled" or "accessed" to each other. It will be understood that the terms "contact," "connected to," and "coupled to" may include a physical and/or electrical contact, connection, or coupling.

The term "on" that is used to designate that an element or layer is on another element or layer includes both a case where an element or layer is located directly on another element or layer, and a case where an element or layer is located on another element or layer via still another element layer. Like reference numerals generally denote like elements throughout the specification.

It will be understood that, although the terms "first," "second," and the like may be used herein to describe various elements, these elements should not be limited by these terms. These terms are only used to distinguish one element from another element. Thus, a "first" element discussed below could also be termed a "second" element without departing from the teachings of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in more detail with reference to the accompanying drawings.

Figure 2:
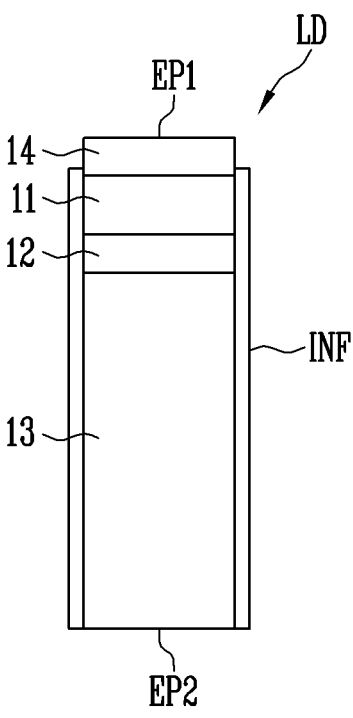
FIG. 2 is a schematic cross-sectional view illustrating the light emitting element in accordance with the embodiment of the disclosure.

FIG. 1 is a schematic perspective view illustrating a light emitting element in accordance with an embodiment of the disclosure. FIG. 2 is a schematic sectional view illustrating the light emitting element in accordance with the embodiment of the disclosure. Although FIGS. 1 and 2 illustrate a pillar-shaped light emitting element LD, the kind and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be provided in a pillar shape extending in a direction. The light emitting element LD may have a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD. For example, the first semiconductor layer 11 may be disposed at the first end portion EP1 of the light emitting element LD, and the second semiconductor layer 13 may be disposed at the second end portion EP2 of the light emitting element LD.

In some embodiments, the light emitting element LD may be a light emitting element manufactured in a pillar shape through an etching process, etc. In this specification, the term "pillar shape" may include a rod- or bar-like shape of which an aspect ratio is greater than 1, such as a cylinder or a polyprism, and the shape of its section is not particularly limited.

The light emitting element LD may have a size small to a degree of the nanometer scale to the micrometer scale. In an example, the light emitting element LD may have a diameter D (or width) in a range of the nanometer scale to the micrometer scale and/or a length L in a range of the nanometer scale to the micrometer scale. However, the size of the light emitting element LD is not limited thereto, and the size of the light emitting element LD may be variously changed according to design conditions of various types of devices, e.g., a display device, and the like, which use, as a light source, a light emitting device using the light emitting element LD.

The first semiconductor layer 11 may be a first conductivity type semiconductor layer. For example, the first semiconductor layer 11 may include a p-type semiconductor layer. In an example, the first semiconductor layer 11 may include at least one semiconductor material among InAlGaN, GaN, AlGaN, InGaN, AlN, and InN, and include a p-type semiconductor layer doped with a first conductivity type dopant such as Mg. However, the material forming (or constituting) the first semiconductor layer 11 is not limited thereto. In addition, the first semiconductor layer 11 may be configured with various materials.

The active layer 12 may be disposed between the first semiconductor layer 11 and the second semiconductor layer 13. The active layer 12 may include a structure among a single well structure, a multi-well structure, a single quantum well structure, a multi-quantum well (MQW) structure, a quantum dot structure, and a quantum wire structure, but the disclosure is not limited thereto. The active layer 12 may include GaN, InGaN, InAlGaN, AlGaN, AlN, or the like. In addition, the active layer 12 may be configured with various materials.

In case that a voltage which is a threshold voltage or more is applied to ends (e.g., both ends) of the light emitting element LD, the light emitting element LD emits light as electron-hole pairs are combined in the active layer 12. The light emission of the light emitting element LD is controlled by using such a principle, so that the light emitting element LD can be used as a light source for various light emitting devices, including a pixel of a display device.

The second semiconductor layer 13 is formed on the active layer 12, and may include a semiconductor layer having a type different from that of the first semiconductor layer 11. For example, the second semiconductor layer 13 may include an n-type semiconductor layer. In an example, the second semiconductor layer 13 may include any semiconductor material among InAlGaN, GaN, AlGaN, InGaN, AlN, and InN, and include an n-type semiconductor layer doped with a second conductivity type dopant such as Si, Ge, or Sn. However, the material constituting the second semiconductor layer 13 is not limited thereto. In addition, the second semiconductor layer 13 may be configured with various materials.

The electrode layer 14 may be disposed on the first end portion EP1 and/or the second end portion EP2 of the light emitting element LD. Although FIG. 2 illustrates, as an example, a case where the electrode layer 14 is formed on the first semiconductor layer 11, the disclosure is not limited thereto. For example, a separate electrode layer may be further disposed on the second semiconductor layer 13.

The electrode layer 14 may include a transparent metal or a transparent metal oxide. In an example, the electrode layer 14 may include at least one of indium tin oxide (ITO), indium zinc oxide (IZO), zinc oxide (ZnO), and zinc tin oxide (ZTO), but the disclosure is not limited thereto. In case that the electrode layer 14 may be made of a transparent metal or a transparent metal oxide, light generated in the active layer 12 of the light emitting element LD may pass through the electrode layer 14 and be emitted to the outside of the light emitting element LD.

An insulative film INF may be provided on a surface of the light emitting element LD. The insulative film INF may be disposed directly on surfaces of the first semiconductor layer 11, the active layer 12, the second semiconductor layer 13, and/or the electrode layer 14. The insulative film INF may expose the first and second end portions EP1 and EP2 of the light emitting element LD, which have different polarities. In some embodiments, the insulative film INF may expose a side portion of the electrode layer 14 and/or the second semiconductor layer 13, adjacent to the first and second end portions EP1 and EP2 of the light emitting element LD.

The insulative film INF may prevent an electrical short circuit which may occur in case that the active layer 12 contacts (or is in contact with) a conductive material except the first and second semiconductor layers 11 and 13. Also, the insulative film INF may minimize a surface defect of light emitting elements LD, thereby the lifespan and light emission efficiency of the light emitting elements LD.

The insulative film INF may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulative film INF may be configured as a double layer, and layers constituting the double layer may include different materials. In an example, the insulative film INF may be configured as a double layer including aluminum oxide ($AlO_x$) and silicon oxide ($SiO_x$), but the disclosure is not limited thereto. In some embodiments, the insulative film INF may be omitted.

A light emitting device including the above-described light emitting element LD may be used in various kinds of devices which require a light source, including a display device. For example, light emitting elements LD may be disposed in each pixel of a display panel, and be used as a light source of each pixel. However, the application field of the light emitting element LD is not limited to the above-described example. For example, the light emitting element LD may be used in other types of devices that require a light source, such as a lighting device.

Figure 3:
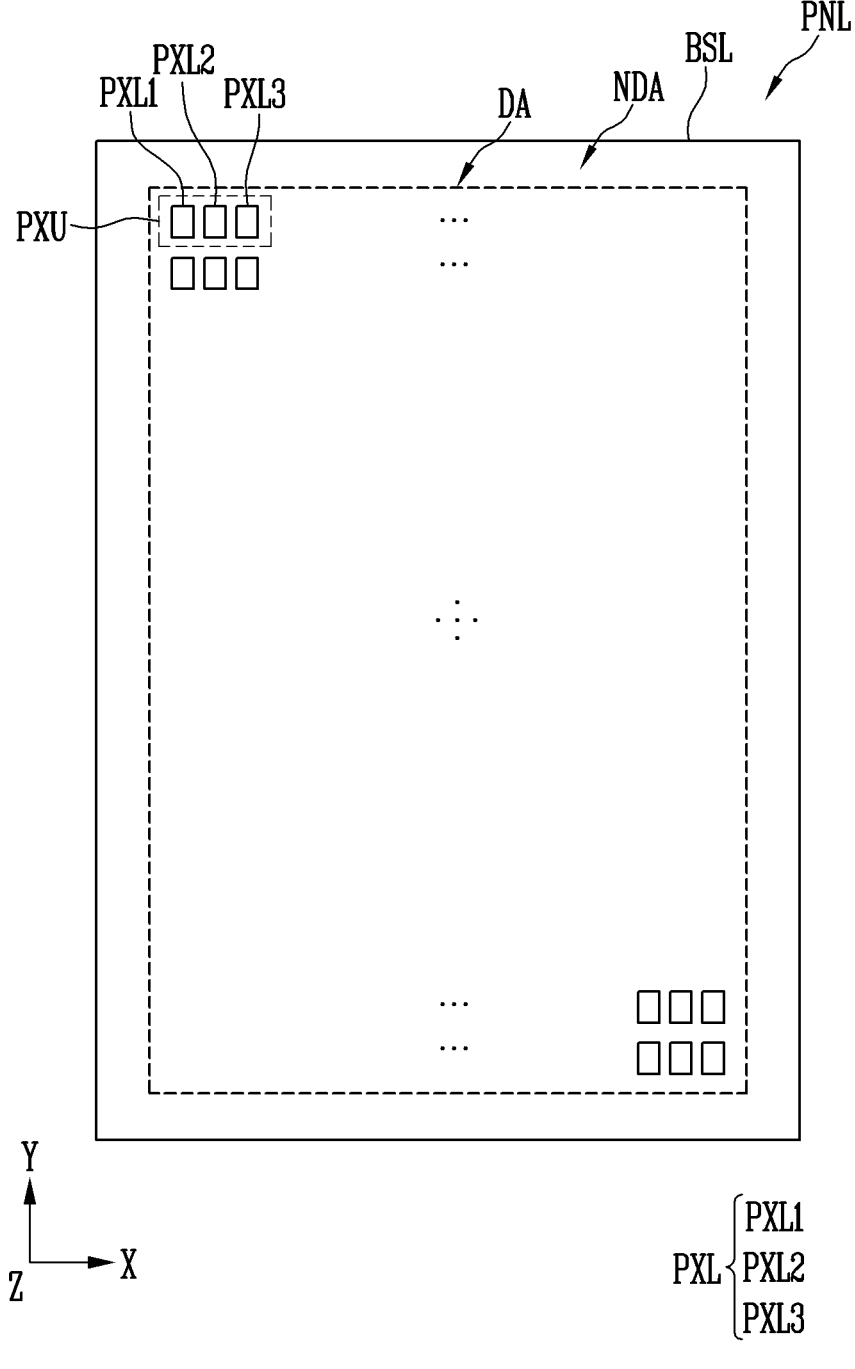
FIG. 3 is a schematic plan view illustrating a display device in accordance with an embodiment of the disclosure.

FIG. 3 is a schematic plan view illustrating a display device in accordance with an embodiment of the disclosure.

FIG. 3 illustrates a display device, particularly, a display panel PNL provided in the display device as an example of an electronic device which can use, as a light source, the light emitting element LD described in the embodiment shown in FIGS. 1 and 2.

For convenience of description, FIG. 3 briefly illustrates a structure of the display panel PNL, focusing on a display area DA. However, in some embodiments, at least one driving circuit (e.g., at least one of a scan driver and a data driver), lines, and/or pads, which are not shown in the drawing, may be further disposed in the display panel PNL.

Referring to FIG. 3, the display panel PNL and a base layer BSL for forming the same may include the display area DA for displaying an image and a non-display area NDA except the display area DA. The display area may form a screen on which the image is displayed, and the non-display area NDA may be the other area except the display area DA.

A pixel part (or pixel unit) PXU may be disposed in the display area DA. The pixel part PXU may include a first pixel PXL1, a second pixel PXL2, and/or a third pixel PXL3. Hereinafter, in case that at least one pixel among the first pixel PXL1, the second pixel PXL2, and the third pixel PXL3 is arbitrarily designated or in case that two or more kinds of pixels among the first pixel PXL1, the second pixel PXL2, and the third pixel PXL3 are inclusively designated, the corresponding pixel or the corresponding pixels will be referred to as a "pixel PXL" or "pixels PXL."

The pixels PXL may be regularly arranged according to a stripe structure, a PENTILE™ structure, or the like. However, the arrangement structure of the pixels PXL is not limited thereto, and the pixels PXL may be arranged in the display area DA by using various structures and/or methods.

In some embodiments, two or more kinds of pixels PXL emitting lights of different colors may be disposed in the display area DA. In an example, first pixels PXL1 emitting light of a first color, second pixels PXL2 emitting light of a second color, and third pixels PXL3 emitting light of a third color may be arranged in the display area DA. At least one first pixel PXL1, at least one second pixel PXL2, and at least one third pixel PXL3, which are disposed adjacent to each other, may constitute a pixel part PXU capable of emitting lights of various colors. For example, each of the first to third pixels PXL1, PXL2, and PXL3 may be a pixel emitting light of a color (e.g., a predetermined or selected color). In some embodiments, the first pixel PXL1 may be a red pixel emitting light of red, the second pixel PXL2 may be a green pixel emitting light of green, and the third pixel PXL3 may be a blue pixel emitting light of blue. However, the disclosure is not limited thereto.

In an embodiment, the first pixel PXL1, the second pixel PXL2, and the third pixel PXL3 have light emitting elements emitting light of a same color, and may include color conversion layers and/or color filters of different colors, which are disposed on the respective light emitting elements, to respectively emit lights of the first color, the second color, and the third color. In an embodiment, the first pixel PXL1, the second pixel PXL2, and the third pixel PXL3 respectively have, as light sources, a light emitting element of the first color, a light emitting element of the second color, and a light emitting element of the third color, so that the light emitting elements can respectively emit lights of the first color, the second color, and the third color. However, the color, kind, and/or number of pixels PXL constituting each pixel part PXU are not particularly limited. In an example, the color of light emitted by each pixel PXL may be variously changed.

The pixel PXL may include at least one light source driven by a control signal (e.g., a scan signal and a data signal) and/or a power source (e.g., a first power source and a second power source). In an embodiment, the light source may include at least one light emitting element LD in accordance with the embodiment shown in FIGS. 1 and 2, e.g., a subminiature pillar-shaped light emitting element LD having a size small to a degree of the nanometer scale to the micrometer scale. However, the disclosure is not limited thereto. In addition, various types of light emitting elements LD may be used as the light source of the pixel PXL.

In an embodiment, each pixel PXL may be configured as an active pixel. However, the kind, structure, and/or driving method of pixels PXL which can be applied to the display device are not particularly limited. For example, each pixel PXL may be configured as a pixel of a passive or active light emitting display device using various structures and/or driving methods.

Figure 4:
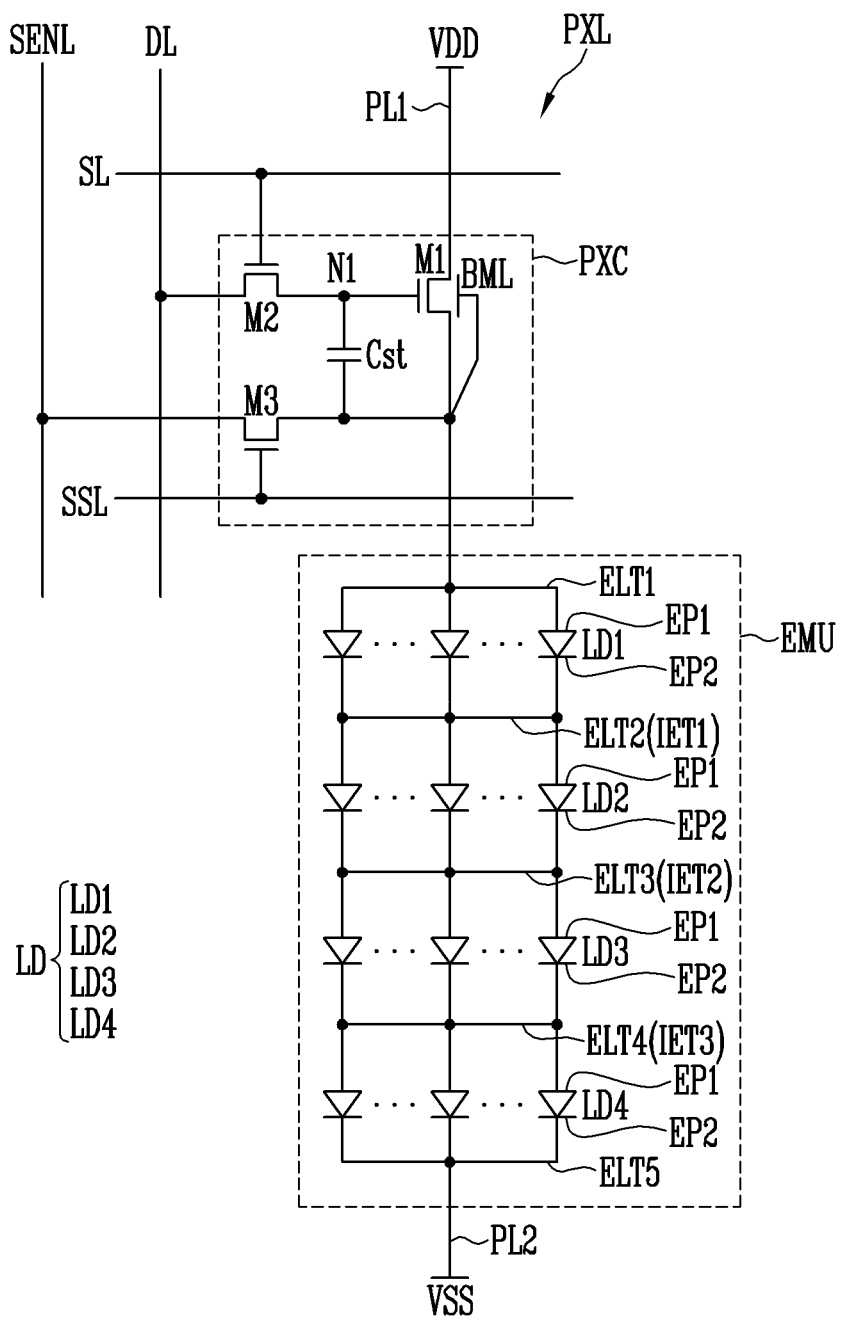
FIG. 4 is a schematic diagram of an equivalent circuit illustrating a pixel in accordance with an embodiment of the disclosure.

FIG. 4 is a schematic diagram of an equivalent circuit illustrating a pixel in accordance with an embodiment of the disclosure.

In some embodiments, the pixel PXL shown in FIG. 4 may be one of the first pixel PXL1, the second pixel PXL2, and the third pixel PXL3, which are provided in the display panel PNL shown in FIG. 3. The first pixel PXL1, the second pixel PXL2, and the third pixel PXL3 may have structures substantially identical or similar to one another.

Referring to FIG. 4, the pixel PXL may include a light emitting part (or light emitting unit) EMU for generating light with a luminance corresponding to a data signal and a pixel circuit PXC for driving the light emitting part EMU.

The pixel circuit PXC may be connected between a first power source VDD and the light emitting part EMU. Also, the pixel circuit PXC may be connected to a scan line SL and a data line DL of the corresponding pixel PXL to control an operation of the light emitting part EMU, corresponding to a scan signal and a data signal, which are supplied from the scan line SL and the data line DL. Also, the pixel circuit PXC may be selectively further connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power source VDD and a first connection electrode ELT1. A gate electrode of the first transistor M1 is connected to a first node N1. The first transistor M1 may control a driving current supplied to the light emitting part EMU, corresponding to a voltage of the first node N1. For example, the first transistor M1 may be a driving transistor for controlling the driving current of the pixel PXL.

In an embodiment, the first transistor M1 may selectively include a lower conductive layer BML (also referred to as a "lower electrode," a "back gate electrode," or a "lower light blocking layer"). The gate electrode and the lower conductive layer BML of the first transistor M1 may overlap each other with an insulating layer interposed therebetween. In an embodiment, the lower conductive layer BML may be connected to one (or first) electrode, e.g., a source or drain electrode of the first transistor M1.

In case that the first transistor M1 includes the lower conductive layer BML, there may be applied a back-biasing technique (or sync technique) for moving a threshold voltage of the first transistor M1 in a negative or positive direction by applying a back-biasing voltage to the lower conductive layer BML of the first transistor M1 in driving the pixel PXL. In an example, a source-sync technique is applied by connecting the lower conductive layer BML to a source electrode of the first transistor M1, so that the threshold voltage of the first transistor M1 can be moved in the negative or positive direction. In addition, in case that the lower conductive layer BML is disposed on the bottom of a semiconductor pattern forming a channel of the first transistor M1, the lower conductive layer BML severs as a light blocking pattern, thereby stabilizing operational characteristics of the first transistor M1. However, the function and/or application method of the lower conductive layer BML is not limited thereto.

The second transistor M2 may be connected between the data line DL and the first node N1. In addition, a gate electrode of the second transistor M2 is connected to the scan line SL. The second transistor M2 is turned on in case that a scan signal having a gate-on voltage (e.g., a high-level voltage) is supplied from the scan line SL, to connect the data line DL and the first node N1 to each other.

A data signal of a corresponding frame may be supplied to the data line DL for each frame period. The data signal may be transferred to the first node N1 through the turned-on second transistor M2 during a period in which the scan signal having the gate-on voltage is supplied. For example, the second transistor M2 may be a switching transistor for transferring each data signal to the inside of the pixel PXL.

A first electrode of the storage capacitor Cst may be connected to the first node N1, and a second electrode of the storage capacitor Cst may be connected to a second electrode of the first transistor M1. The storage capacitor Cst is charged with a voltage corresponding to the data signal supplied to the first node N1 during each frame period.

The third transistor M3 may be connected between the first connection electrode ELT1 (or the second electrode of the first transistor M1) and the sensing line SENL. In addition, a gate electrode of the third transistor M3 may be connected to the sensing signal line SSL. The third transistor M3 may transfer a voltage value, applied to the first connection electrode ELT1, to the sensing line SENL according to a sensing signal supplied to the sensing signal line SSL. The voltage value transferred through the sensing line SENL may be provided to an external circuit (e.g., a timing controller), and the external circuit may extract characteristic information (e.g., the threshold voltage of the first transistor M1, etc.), based on the provided voltage value. The extracted characteristic information may be used to convert image data such that a characteristic deviation between the pixels PXL is compensated.

Although FIG. 4 illustrates that the transistors included in the pixel circuit PXC are an n-type transistor, the disclosure is not limited thereto. For example, at least one of the first, second, and third transistors M1, M2, and M3 may be changed to a p-type transistor.

In addition, the structure and driving method of the pixel PXL may be variously changed in some embodiments. For example, the pixel circuit PXC may be configured as a pixel circuit having various structures and/or various driving methods, in addition to the embodiment shown in FIG. 4.

In an example, the pixel circuit PXC may not include the third transistor M3. Also, the pixel circuit PXC may further include other circuit elements such as a compensation transistor for compensating for the threshold voltage of the first transistor M1, etc., an initialization transistor for initializing a voltage of the first node N1 and/or the first connection electrode ELT1, an emission control transistor for controlling a period in which a driving current is supplied to the light emitting part EMU, and/or a boosting capacitor for boosting the voltage of the first node N1.

The light emitting part EMU may include at least one light emitting element LD, e.g., light emitting elements LD connected to each other between the first power source VDD and a second power source VSS.

For example, the light emitting part EMU may include the first connection electrode ELT1 connected to the first power source VDD through the pixel circuit PXC and a first power line PL1, a fifth connection electrode ELT5 connected to the second power source VSS through a second power line PL2, and light emitting elements LD connected to each other between the first and fifth connection electrodes ELT1 and ELT5.

The first power source VDD and the second power source VSS may have different potentials such that the light emitting elements LD can emit light. In an example, the first power source VDD may be set as a high-potential power source, and the second power source VSS may be set as a low-potential power source.

In an embodiment, the light emitting part EMU may include at least one serial stage. Each serial stage may include a pair of electrodes (e.g., two electrodes) and at least one light emitting element LD connected in a forward direction between the pair of electrodes. The number of serial stages constituting the light emitting part EMU and the number of light emitting elements LD constituting each serial stage are not particularly limited. In an example, the numbers of light emitting elements LD constituting the respective serial stages may be equal to or different from each other, and the number of light emitting elements LD is not particularly limited.

For example, the light emitting part EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include the first connection electrode ELT1, a second connection electrode ELT2, and at least one first light emitting element LD1 connected to each other between the first and second connection electrodes ELT1 and ELT2. Each first light emitting element LD1 may be connected in the forward direction between the first and second connection electrodes ELT1 and ELT2. For example, a first end portion EP1 of the first light emitting element LD1 may be connected to the first connection electrode ELT1, and a second end portion EP2 of the first light emitting element LD1 may be connected to the second connection electrode ELT2.

The second serial stage may include the second connection electrode ELT2 and a third connection electrode ELT3, and at least one second light emitting elements LD2 connected to each other between the second and third connection electrodes ELT2 and ELT3. Each second light emitting element LD2 may be connected in the forward direction between the second and third connection electrodes ELT2 and ELT3. For example, a first end portion EP1 of the second light emitting element LD2 may be connected to the second connection electrode ELT2, and a second end portion EP2 of the second light emitting element LD2 may be connected to the third connection electrode ELT3.

The third serial stage may include the third connection electrode ELT3 and a fourth connection electrode ELT4, and at least one third light emitting elements LD3 connected to each other between the third and fourth connection electrodes ELT3 and ELT4. Each third light emitting element LD3 may be connected in the forward direction between the third and fourth connection electrodes ELT3 and ELT4. For example, a first end portion EP1 of the third light emitting element LD3 may be connected to the third connection electrode ELT3, and a second end portion EP2 of the third light emitting element LD3 may be connected to the fourth connection electrode ELT4.

The fourth serial stage may include the fourth connection electrode ELT4 and the fifth connection electrode ELT5, and at least one fourth light emitting elements LD4 connected to each other between the fourth and fifth connection electrodes ELT4 and ELT5. Each fourth light emitting element LD4 may be connected in the forward direction between the fourth and fifth connection electrodes ELT4 and ELT5. For example, a first end portion EP1 of the fourth light emitting element LD4 may be connected to the fourth connection electrode ELT4, and a second end portion EP2 of the fourth light emitting element LD4 may be connected to the fifth connection electrode ELT5.

A first electrode, e.g., the first connection electrode ELT1 of the light emitting part EMU may be an anode electrode of the light emitting part EMU. A last electrode, e.g., the fifth connection electrode ELT5 of the light emitting part EMU may be a cathode electrode of the light emitting part EMU.

The other electrodes, e.g., the second connection electrode ELT2, the third connection electrode ELT3, and/or the fourth connection electrode ELT4 of the light emitting part EMU may constitute respective intermediate electrodes. For example, the second connection electrode ELT2 may form a first intermediate electrode IET1, the third connection electrode ELT3 may form a second intermediate electrode IET2, and the fourth connection electrode ELT4 may form a third intermediate electrode IET3.

In case that light emitting elements LD are connected to each other in a series-parallel structure, power efficiency can be improved as compared with when light emitting elements LD of which the number is equal to that of the above-described light emitting elements LD are connected to each other only in parallel. In addition, in the pixel in which the light emitting elements LD are connected to each other in the series-parallel structure, although a short defect (or short circuit defect) or the like occurs in some serial stages, a luminance (e.g., a predetermined or selected luminance) can be expressed through light emitting elements LD of the other serial stage. Hence, the probability that a dark spot defect will occur in the pixel PXL can be reduced. However, the disclosure is not limited thereto, and the light emitting part EMU may be configured by connecting the light emitting elements LD to each other only in series or by connecting the light emitting elements LD to each other only in parallel.

Each of the light emitting element LD may include a first end portion EP1 (e.g., a p-type end portion) connected to the first power source VDD via at least one electrode (e.g., the first connection electrode ELT1), the pixel circuit PXC, and/or the first power line PL1, and a second end portion EP2 (e.g., an n-type end portion) connected to the second power source VSS via at least another electrode (e.g., the fifth connection electrode ELT5) and the second power line PL2. For example, the light emitting elements LD may be connected to each other in the forward direction between the first power source VDD and the second power source VSS. The light emitting elements LD connected to each other in the forward direction may constitute effective light sources of the light emitting part EMU.

In case that a driving current is supplied through the corresponding pixel circuit PXC, the light emitting elements LD may emit light with a luminance corresponding to the driving current. For example, during each frame period, the pixel circuit PXC may supply, to the light emitting part EMU, a driving current corresponding to a grayscale value to be expressed in a corresponding frame. Accordingly, while the light emitting elements LD emit light with the luminance corresponding to the driving current, the light emitting part EMU can express the luminance corresponding to the driving current.

Figure 5:
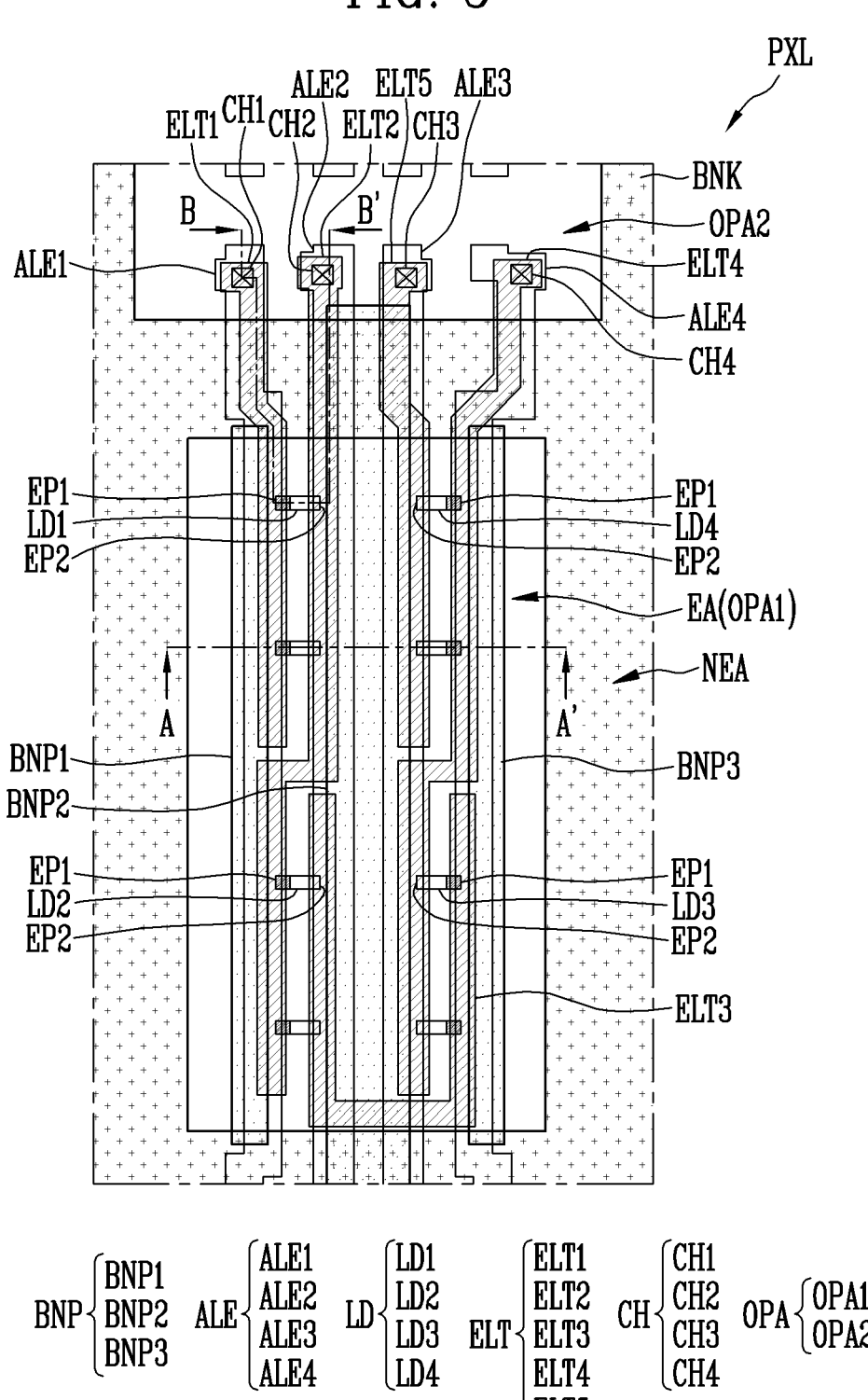
FIG. 5 is a schematic plan view illustrating a pixel in accordance with an embodiment of the disclosure.
Figure 6:
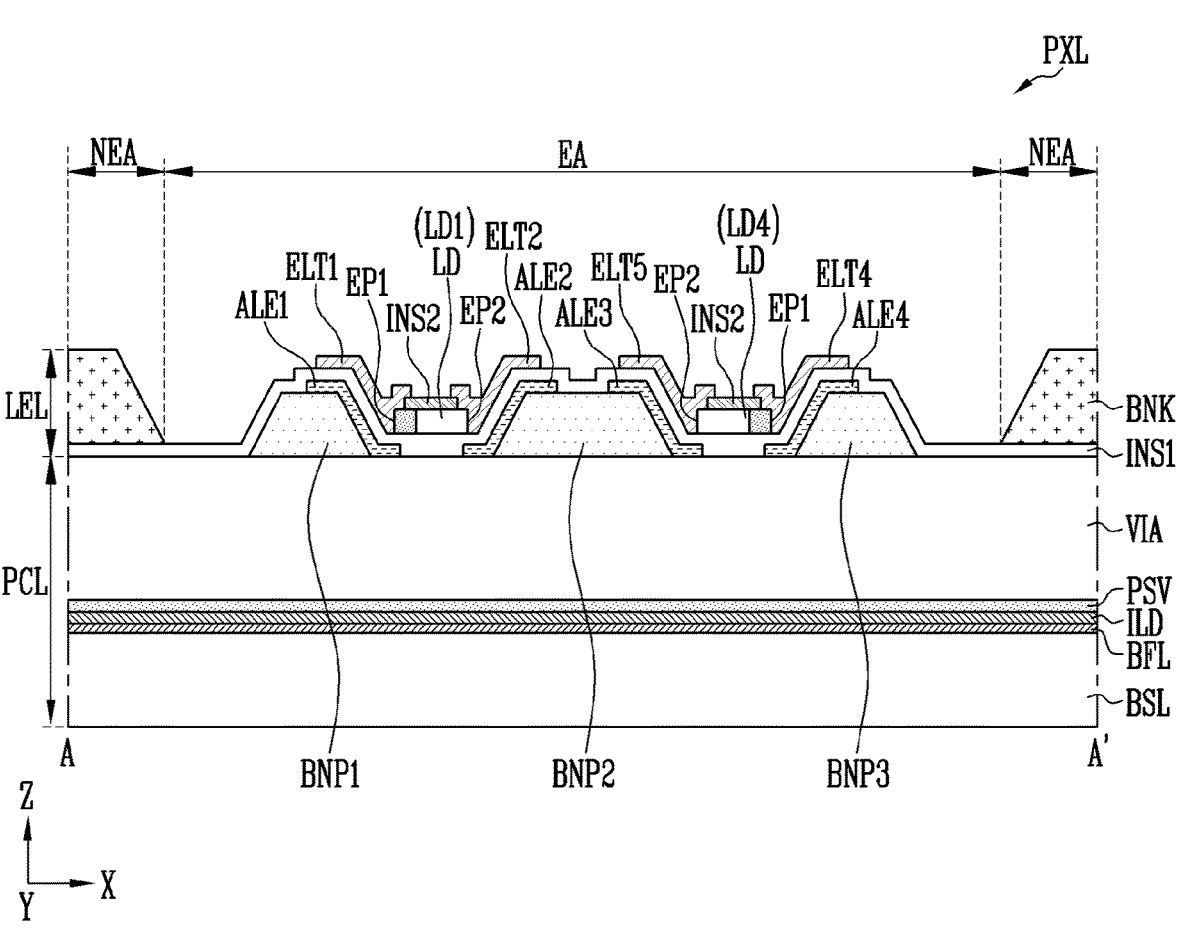
FIG. 6 is a schematic cross-sectional view taken along line A-A' shown in FIG. 5.
Figure 7:
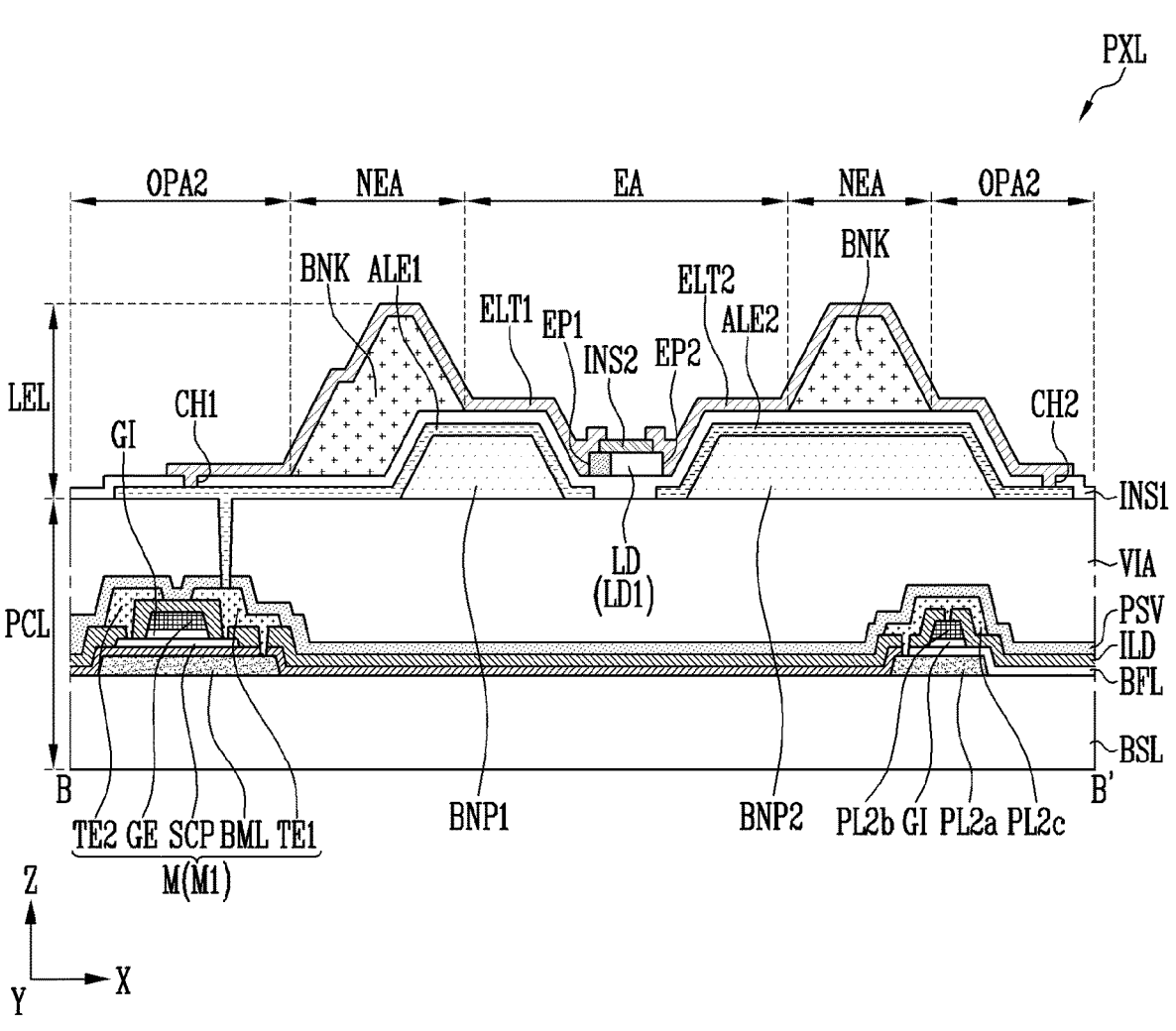
FIG. 7 is a schematic cross-sectional view taken along line B-B' shown in FIG. 5.

FIG. 5 is a schematic plan view illustrating a pixel in accordance with an embodiment of the disclosure. FIG. 6 is a schematic sectional view taken along line A-A' shown in FIG. 5. FIG. 7 is a schematic sectional view taken along line B-B' shown in FIG. 5.

In an example, the pixel PXL shown in FIG. 5 may be one of the first to third pixels PXL1, PXL2, and PXL3 constituting the pixel part PXU shown in FIG. 3, and the first to third pixels PXL1, PXL2, and PXL3 may have structures substantially identical or similar to one another. In addition, although FIG. 5 illustrates an embodiment in which each pixel PXL includes light emitting elements LD disposed in four serial stages as shown in FIG. 4, the number of serial stages of each pixel PXL may be variously changed in some embodiments.

Hereinafter, in case that at least one of first to fourth light emitting elements LD1, LD2, LD3, and LD4 is arbitrarily designated or in case that two or more kinds of light emitting elements are inclusively designated, the corresponding light emitting element or the corresponding light emitting elements will be referred to as a "light emitting element LD" or "light emitting elements LD." In addition, in case that at least one electrode among electrodes including first to fourth electrodes ALE1, ALE2, ALE3, and ALE4 is arbitrarily designated or in case that two or more kinds of electrodes are inclusively designated, the corresponding electrode or the corresponding electrodes will be referred to as an "electrode ALE" or "electrodes ALE." In case that at least one connection electrode among connection electrodes including first to fifth connection electrodes ELT1, ELT2, ELT3, ELT4, and ELT5 is arbitrarily designated or in case that two or more kinds of connection electrodes are inclusively designated, the corresponding connection electrode or the corresponding connection electrodes will be referred to as a "connection electrode ELT" or "connection electrodes ELT."

Referring to FIG. 5, each pixel PXL may include an emission area EA and a non-emission area NEA. The emission area EA may be an area including light emitting elements LD to emit light. The non-emission area NEA may be disposed to surround the emission area EA. The non-emission area NEA may be an area in which a bank BNK surrounding the emission area EA is provided. The bank BNK may include openings OPA including a first opening area OPA1 overlapping the emission area EA and a second opening area OPA2 overlapping the non-emission area NEA.

Each pixel PXL may include electrodes ALE, light emitting elements LD, and/or connection electrodes ELT. The electrodes ALE may be provided in at least the emission area EA. The electrodes ALE may extend in a second direction (Y-axis direction), and be spaced apart from each other in a first direction (X-axis direction). The electrodes ALE may extend from the emission area EA to the non-emission area NEA. For example, the electrodes ALE may extend from the emission area EA to the second opening area OPA2. Each of the first to fourth electrodes ALE1, ALE2, ALE3, and ALE4 may extend in the second direction (Y-axis direction), and be spaced apart from each other in the first direction (X-axis direction) to be sequentially disposed.

Some of the electrodes ALE may be connected to the pixel circuit PXC (see FIG. 4) and/or a power line. For example, the first electrode ALE1 may be connected to the pixel circuit PXC and/or the first power line PL1, and the third electrode ALE3 may be connected to the second power line PL2.

In some embodiments, some of the electrodes ALE may be electrically connected to some of the connection electrodes ELT through contact holes CH. For example, the first electrode ALE1 may be electrically connected to the first connection electrode ELT1 through a first contact hole CH1, the second electrode ELT2 may be electrically connected to the second connection electrode ELT2 through a second contact hole CH2, the third electrode ALE3 may be electrically connected to the fifth connection electrode ELT5 through a third contact hole CH3, and the fourth electrode ELT4 may be electrically connected to the fourth connection electrode ELT4 through a fourth contact hole CH4. The first to fourth contact holes CH1, CH2, CH3, and CH4 may be located in the second opening area OPA2, but the disclosure is not limited thereto.

A pair of electrodes ALE adjacent to each other may be supplied with different signals in a process of aligning the light emitting elements LD. For example, in case that the first to fourth electrodes ALE1, ALE2, ALE3, and ALE4 are sequentially arranged in the first direction (X-axis direction) in the emission area EA, the first and second electrodes ALE1 and ALE2 may form a pair to be supplied with different alignment signals, and the third and fourth electrodes ALE3 and ALE4 may form a pair to be supplied with different alignment signals.

In an embodiment, the second and third electrodes ALE2 and ALE3 may be supplied with a same signal in the process of aligning the light emitting elements LD. Although FIG. 5 illustrates that the second and third electrodes ALE2 and ALE3 are separated from each other, the second and third electrodes ALE2 and ALE3 may be integrally or non-integrally connected to each other in the process of aligning the light emitting elements LD.

In some embodiments, bank patterns BNP may be disposed on the bottom of the electrodes ALE. The bank patterns BNP may include a first bank pattern BNP1, a second bank pattern BNP2, and a third bank pattern BNP3. The bank patterns BNP may be provided in at least the emission area EA. The bank patterns BNP may extend in the second direction (Y-axis direction), and be spaced apart from each other in the first direction (X-axis direction).

In case that each of the bank patterns BNP is provided on the bottom of one area of each of the electrodes ALE, one area of each of the electrodes ALE may protrude in an upward direction of the pixel PXL, for example, a third direction (Z-axis direction) in an area in which each of the bank patterns BNP is formed. In case that the bank patterns BNP and/or the electrodes ALE include a reflective material, a reflective wall structure may be formed at the periphery of the light emitting elements LD. Accordingly, light emitted from the light emitting elements LD can be emitted in the upward direction of the pixel PXL (e.g., a front direction of the display panel PNL, including a viewing angle range (e.g., a predetermined or selected viewing angle range)), and thus the light emission efficiency of the display panel PNL can be improved.

Each of the light emitting elements LD may be aligned between a pair of electrodes ALE in the emission area EA. Also, each of the light emitting elements LD may be electrically connected between a pair of connection electrodes ELT.

The first light emitting element LD1 may be aligned between the first and second electrodes ALE1 and ALE2. The first light emitting element LD1 may be electrically connected between the first and second connection electrodes ELT1 and ELT2. In an example, the first light emitting element LD1 may be aligned in a first area (e.g., an upper end area) of the first and second electrodes ALE1 and ALE2. A first end portion EP1 of the first light emitting element LD1 may be electrically connected to the first connection electrode ELT1, and a second end portion EP2 of the first light emitting element LD1 may be electrically connected to the second connection electrode ELT2.

The second light emitting element LD2 may be aligned between the first and second electrodes ALE1 and ALE2. The second light emitting element LD2 may be electrically connected between the second and third connection electrodes ELT2 and ELT3. In an example, the second light emitting element LD2 may be aligned in a second area (e.g., a lower end area) of the first and second electrodes ALE1 and ALE2. A first end portion EP1 of the second light emitting element LD2 may be electrically connected to the second connection electrode ELT2, and a second end portion EP2 of the second light emitting element LD2 may be electrically connected to the third connection electrode ELT3.

The third light emitting element LD3 may be aligned between the third and fourth electrodes ALE3 and ALE4. The third light emitting element LD3 may be electrically connected between the third and fourth connection electrodes ELT3 and ELT4. In an example, the third light emitting element LD3 may be aligned in a second area (e.g., a lower end area) of the third and fourth electrodes ALE3 and ALE4. A first end portion EP1 of the third light emitting element LD3 may be electrically connected to the third connection electrode ELT3, and a second end portion EP2 of the third light emitting element LD3 may be electrically connected to the fourth connection electrode ELT4.

The fourth light emitting element LD4 may be aligned between the third and fourth electrodes ALE3 and ALE4. The fourth light emitting element LD4 may be electrically connected between the fourth and fifth connection electrodes ELT4 and ELT5. In an example, the fourth light emitting element LD4 may be aligned in a first area (e.g., an upper end area) of the third and fourth electrodes ALE3 and ALE4. A first end portion EP1 of the fourth light emitting element LD4 may be electrically connected to the fourth connection electrode ELT4, and a second end portion EP2 of the fourth light emitting element LD4 may be electrically connected to the fifth connection electrode ELT5.

In an example, the first light emitting element LD1 may be located in a left upper end area of the emission area EA, and the second light emitting element LD2 may be located in a left lower end area of the emission area EA. The third light emitting elements LD3 may be located at a right lower end area of the emission area EA, and the fourth light emitting element LD4 may be located in a right upper end area of the emission area EA. However, the arrangement and/or connection structure of the light emitting elements LD may be variously changed according to the structure of the light emitting part EMU and/or the number of serial stages.

Each of the connection electrodes ELT may be provided in at least the emission area EA, and be disposed to overlap at least one electrode ALE and/or at least one light emitting element LD. For example, each of the connection electrodes ELT may be formed on the electrodes ALE and/or the light emitting elements LD to overlap the electrodes ALE and/or the light emitting elements LD. Therefore, each of the electrodes ELT may be electrically connected to the light emitting elements LD.

The first connection electrode ELT1 may be disposed on the first area (e.g., the upper end area) of the first electrode ALE1 and the first end portions EP1 of the first light emitting elements LD1, to be electrically connected to the first end portions EP1 of the first light emitting elements LD1.

The second connection electrode ELT2 may be disposed on the first area (e.g., the upper end area) of the second electrode ALE2 and the second end portions EP2 of the first light emitting elements LD1, to be electrically connected to the second end portions EP2 of the first light emitting elements LD1. Also, the second connection electrode ELT2 may be disposed on the second area (e.g., the lower end area) of the first electrode ALE1 and the first end portions EP1 of the second light emitting elements LD2, to be electrically connected to the first end portions EP1 of the second light emitting elements LD2. For example, the second connection electrode ELT2 may electrically connect the second end portions EP2 of the first light emitting elements LD1 and the first end portions EP1 of the second light emitting elements LD2 to each other in the emission area EA. To this end, the second connection electrode ELT2 may have a bent shape. For example, the second connection electrode ELT2 may have a structure bent or curved at a boundary between an area in which at least one first light emitting element LD1 is arranged and an area in which at least one second light emitting element LD2 is arranged.

The third connection electrode ELT3 may be disposed on the second area (e.g., the lower end area) of the second electrode ALE2 and the second end portions EP2 of the second light emitting elements LD2, to be electrically connected to the second end portions EP2 of the second light emitting elements LD2. Also, the third connection electrode ELT3 may be disposed on the second area (e.g., the lower end area) of the fourth electrode ALE4 and the first end portions EP1 of the third light emitting elements LD3, to be electrically connected to the first end portions EP1 of the third light emitting elements LD3. For example, the third connection electrode ELT3 may electrically connect the second end portions EP2 of the second light emitting elements LD2 and the first end portions EP1 of the third light emitting elements LD3 to each other in the emission area EA. To this end, the third connection electrode ELT3 may have a bent shape. For example, the third connection electrode ELT3 may have a structure bent or curved at a boundary between an area in which at least one second light emitting element LD2 is arranged and an area in which at least one third light emitting element LD3 is arranged.

The fourth connection electrode ELT3 may be disposed on the second area (e.g., the lower end area) of the third electrode ALE3 and the second end portions EP2 of the third light emitting elements LD3, to be electrically connected to the second end portions EP2 of the third light emitting elements LD3. Also, the fourth connection electrode ELT4 may be disposed on the first area (e.g., the upper end area) of the fourth electrode ALE4 and the first end portions EP1 of the fourth light emitting elements LD4, to be electrically connected to the first end portions EP1 of the fourth light emitting elements LD4. For example, the fourth connection electrode ELT4 may electrically connect the second end portions EP2 of the third light emitting elements LD3 and the first end portions EP1 of the fourth light emitting elements LD4 to each other in the emission area EA. To this end, the fourth connection electrode ELT4 may have a bent shape. For example, the fourth connection electrode ELT4 may have a structure bent or curved at a boundary between an area in which at least one third light emitting element LD3 is arranged and an area in which at least one fourth light emitting element LD4 is arranged.

The fifth connection electrode ELT5 may be disposed on the first area (e.g., the upper end area) of the third electrode ALE3 and the second end portions EP2 of the fourth light emitting elements LD4, to be electrically connected to the second end portions EP2 of the fourth light emitting elements LD4.

In the above-described manner, the light emitting elements LD aligned between the electrodes ALE may be connected to each other in a desired form by using the connection electrodes ELT. For example, the first light emitting elements LD1, the second light emitting elements LD2, the third light emitting elements LD3, and the fourth light emitting elements LD4 may be sequentially connected to each other in series by using the connection electrodes ELT.

Hereinafter, focusing on a light emitting element LD, a sectional structure of each pixel PXL will be described in detail with reference to FIGS. 6 and 7. FIGS. 6 and 7 illustrate a pixel circuit layer PCL and a light emitting element layer LEL. FIG. 7 illustrates first transistor M1 among various circuit elements constituting the pixel circuit PXC (see FIG. 4). In case that the first to third transistors M1, M2, and M3 are designated without being distinguished from each other, each of the first to third transistors M1, M2, and M3 will be inclusively referred to as a "transistor M." The structure of transistors M and/or the positions of the transistors M for each layer is not limited to the embodiment shown in FIG. 7, and may be variously changed in some embodiments.

Referring to FIGS. 6 and 7, the pixel circuit layer PCL and the light emitting element layer LEL of the pixel PXL in accordance with the embodiment of the disclosure may include circuit elements including transistors M disposed on a base layer BSL and various lines connected thereto. The light emitting element layer LEL including electrodes ALE, light emitting elements LD, and/or connection electrodes ELT may be disposed on the pixel circuit layer PCL.

The base layer BSL may be a rigid or flexible substrate or a film. In an example, the base layer BSL may be a rigid substrate made of glass or tempered glass, a flexible substrate (or thin film) made of a plastic or metal material, or at least one insulating layer. The material and/or property of the base layer BSL is not particularly limited. In an embodiment, the base layer BSL may be substantially transparent. The phrase "substantially transparent" may mean that light can be transmitted with a transmittance or more. In an embodiment, the base layer BSL may be translucent or opaque. Also, the base layer BSL may include a reflective material in some embodiments.

A lower conductive layer BML and a first power conductive layer PL2a may be disposed on the base layer BSL. The lower conductive layer BML and the first power conductive layer PL2a may be disposed in a same layer. For example, the lower conductive layer BML and the first power conductive layer PL2a may be simultaneously formed through a same process, but the disclosure is not limited thereto. The first power conductive layer PL2a may form the second power line PL2 described with reference to FIG. 4 and the like.

Each of the lower conductive layer BML and the first power conductive layer PL2a may be formed as a single layer or a multi-layer, which is made of at least one of molybdenum (Mo), copper (Cu), aluminum (Al), chromium (Cr), gold (Au), silver (Ag), titanium (Ti), nickel (Ni), neodymium (Nd), indium (In), tin (Sn), and any oxide or ally thereof.

A buffer layer BFL may be disposed over the lower conductive layer BML and the first power conductive layer PL2a. The buffer layer BFL may prevent an impurity from being diffused into each circuit element. The buffer layer BFL may be configured as a single layer, and may also be configured as a multi-layer including at least two layers. In case that the buffer layer BFL is provided as the multi-layer, the layers may be formed of a same material or be formed of different materials.

A semiconductor pattern SCP may be disposed on the buffer layer BFL. In an example, the semiconductor pattern SCP may include a first region in contact with a first transistor electrode TE1, a second region in contact with a second transistor electrode ET2, and a channel region located between the first and second regions. In some embodiments, one of the first and second regions may be a source region, and the other of the first and second regions may be a drain region.

In some embodiments, the semiconductor pattern SCP may be made of polysilicon, amorphous silicon, oxide semiconductor, etc. In addition, the channel region of the semiconductor pattern SCP is a semiconductor pattern undoped with an impurity, and may be an intrinsic semiconductor. Each of the first and second regions of the semiconductor pattern SCP may be a semiconductor pattern doped with an impurity.

A gate insulating layer GI may be disposed on the buffer layer BFL and the semiconductor pattern SCP. In an example, the gate insulating layer GI may be disposed between the semiconductor pattern SCP and a gate electrode GE. Also, the gate insulating layer GI may be disposed between the buffer layer BFL and a second power conductive layer PL2b. The gate insulating layer GI may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE of the transistor M and the second power conductive layer PL2b may be disposed on the gate insulating layer GI. For example, the gate electrode GE and the second power conductive layer PL2b may be disposed in a same layer. For example, the gate electrode GE and the second power conductive layer PL2b may be simultaneously formed through a same process, but the disclosure is not limited thereto. The gate electrode GE may be disposed on the gate insulating layer GI to overlap the semiconductor pattern SCP in the third direction (Z-axis direction). The second power conductive layer PL2b may be disposed on the gate insulating layer GI to overlap the first power conductive layer PL2a in the third direction (Z-axis direction). The second power conductive layer PL2b along with the first power conductive layer PL2a may constitute the second power line PL2 described with reference to FIG. 4 and the like.

Each of the gate electrode GE and the second power conductive layer PL2b may be formed as a single layer or a multi-layer, which is made of molybdenum (Mo), copper (Cu), aluminum (Al), chromium (Cr), gold (Au), silver (Ag), titanium (Ti), nickel (Ni), neodymium (Nd), indium (In), tin (Sn), and any oxide or alloy thereof.

An interlayer insulating layer ILD may be disposed over the gate electrode GE and the second power conductive layer PL2b. In an example, the interlayer insulating layer ILD may be disposed between the gate electrode GE and the first and second transistor electrodes TE1 and TE2. Also, the interlayer insulating layer ILD may be disposed between the second power conductive layer PL2b and a third power conductive layer PL2c.

The interlayer insulating layer ILD may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 of the transistor M and the third power conductive layer PL2c may be disposed on the interlayer insulating layer ILD. The first and second transistor electrodes TE1 and TE2 and the third power conductive layer PL2c may be disposed in a same layer. For example, the first and second transistor electrodes TE1 and TE2 and the third power conductive layer PL2c may be simultaneously formed through a same process, but the disclosure is not limited thereto.

The first and second transistor electrodes TE1 and TE2 may be disposed to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole penetrating the interlayer insulating layer ILD. Also, the first transistor electrode TE1 may be electrically connected to the lower conductive layer BML through a contact hole penetrating the interlayer insulating layer ILD and the buffer layer BFL. The second transistor electrode TE2 may be electrically connected to the second region of the semiconductor pattern SCP through a contact hole penetrating the interlayer insulating layer ILD. In some embodiments, any of the first and second transistor electrodes TE1 and TE2 may be a source electrode, and the other of the first and second transistor electrodes TE1 and TE2 may be a drain electrode.

The third power conductive layer PLC2c may be disposed to overlap the first power conductive layer PL2a and/or the second power conductive layer PL2b in the third direction (Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole penetrating the interlayer insulating layer ILD and the buffer layer BFL. Also, the third power conductive layer PL2c may be electrically connected to the second power conductive layer PL2b through a contact hole penetrating the interlayer insulating layer ILD. The third power conductive layer PL2c along with the first power conductive layer PL2a and/or the second power conductive layer PL2b may constitute the second power line PL2 described with reference to FIG. 4 and the like.

The first and second transistor electrodes TE1 and TE2 and the third power conductive layer PL2c may be formed as a single layer or a multi-layer, which is made of molybdenum (Mo), copper (Cu), aluminum (Al), chromium (Cr), gold (Au), silver (Ag), titanium (Ti), nickel (Ni), neodymium (Nd), indium (In), tin (Sn), and any oxide or alloy thereof.

A protective layer PSV may be disposed over the first and second transistor electrodes TE1 and TE2 and the third power conductive layer PL2c. The protective layer PSV may be configured as a single layer or a multi-layer, and include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A via layer VIA may be disposed on the protective layer PSV. The via layer VIA may be made of an organic material to planarize a lower step difference. For example, the via layer VIA may include an organic material such as acrylic resin, epoxy resin, phenolic resin, polyamides resin, polyimides resin, polyester resin, polyphenylene sulfide resin, or benzocyclobutene (BCB). However, the disclosure is not limited thereto, and the via layer VIA may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Bank patterns BNP of the light emitting element layer LEL may be disposed on the via layer VIA of the pixel circuit layer PCL. In some embodiments, the bank patterns BNP may have various shapes. In an embodiment, the bank patterns BNP may have a shape protruding in the third direction (Z-axis direction) on the base layer BSL. Also, the bank patterns BNP may have an inclined surface inclined at an angle (e.g., a predetermined or selected angle) with respect to the base layer BSL. However, the disclosure is not limited thereto, and the bank patterns BNP may have a sidewall having a curved shape, a stepped shape, or the like. In an example, the bank patterns BNP may have a section having a semicircular shape, a semi-elliptical shape, or the like.

Electrodes and insulating layers, which are disposed on the top of the bank patterns BNP, may have a shape corresponding to the bank patterns BNP. In an example, electrodes ALE disposed on the patterns BNP may include an inclined surface or a curved surface, which has a shape corresponding to that of the bank patterns BNP. Accordingly, the bank patterns BNP along with the electrodes ALE provided on the top thereof may serve as a reflective member for guiding light, emitted from light emitting elements LD, in a front direction of the pixel PXL, for example, the third direction (Z-axis direction), thereby improving the light emission efficiency of the display panel PNL.

The bank patterns BNP may include at least one organic material and/or at least one inorganic material. In an example, the bank patterns BNP may include an organic material such as acrylic resin, epoxy resin, phenolic resin, polyamide resin, polyimide resin, polyester resin, polyphenylene sulfide resin, or benzocyclobutene (BCB). However, the disclosure is not limited thereto, and the patterns BNP may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The electrodes ALE may be disposed on the via layer VIA and the bank patterns BNP. The electrodes ALE may be disposed to be spaced apart from each other in the pixel PXL. The electrodes ALE may be disposed in a same layer. The electrodes ALE may be simultaneously formed through a same process, but the disclosure is not limited thereto.

The electrodes ALE may be supplied with an alignment signal in a process of aligning the light emitting elements LD. Accordingly, an electric filed is formed between the electrodes ALE, so that the light emitting elements LD provided in each pixel PXL can be aligned between the electrodes ALE.

The electrodes ALE may include at least one conductive material. In an example, the electrodes ALE may include at least one metal among various metallic materials including silver (Ag), magnesium (Mg), aluminum (Al), platinum (Pt), palladium (Pd), gold (Au), silver (Ag), nickel (Ni), neodymium (Nd), iridium (Ir), chromium (Cr), titanium (Ti), molybdenum (Mo), copper (Cu), and the like, or any alloy including the at least one metal, at least one conductive oxide such as indium tin oxide (ITO), indium zinc oxide (IZO), indium tin zinc oxide (ITZO), zinc oxide (ZnO), aluminum-doped zinc oxide (AZO), gallium-doped zinc oxide (GZO), zinc tin oxide (ZTO), or gallium tin oxide (GTO), and the like, and at least one conductive material among conductive polymers such as poly(3,4-ethylenedioxythiophene) (PEDOT), but the disclosure is not limited thereto.

A first insulating layer INS1 may be disposed over the electrodes ALE. The first insulating layer INS1 may be configured as a single layer or a multi-layer, and include various kinds of inorganic insulating materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

A bank BNK may be disposed on the first insulating layer INS1. The bank BNK may form a dam structure defining an emission area in which light emitting elements LD are to be supplied in a process of supplying the light emitting elements LD to each of the pixels PXL. For example, a desired kind and/or amount of light emitting element ink may be supplied to the area defined by the bank BNK.

The bank BNK may include an organic material such as acrylic resin, epoxy resin, phenolic resin, polyamide resin, polyimide resin, polyester resin, polyphenylene sulfide resin, or benzocyclobutene (BCB). However, the disclosure is not limited thereto, and the bank BNK may include various kinds of inorganic insulating materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In some embodiments, the bank BNK may include at least one light blocking material and/or at least one reflective material. Accordingly, light leakage between adjacent pixels PXL can be prevented. For example, the bank BNK may include at least one black matrix material and/or at least one color filter material. In an example, the bank BNK may be formed as a black opaque pattern capable of blocking transmission of light. In an embodiment, a reflective layer or the like may be formed on a surface (e.g., a sidewall) of the bank BNK to increase the light efficiency of each pixel PXL.

The light emitting elements LD may be disposed on the first insulating layer INS1. The light emitting elements LD may be disposed between the electrodes ALE on the first insulating layer INS1. The light emitting elements LD may be prepared in a form in which the light emitting elements LD are dispersed in a light emitting element ink, to be supplied to each of the pixels PXL through an inkjet printing process or the like. In an example, the light emitting elements LD may be dispersed in a volatile solvent to be provided to each pixel PXL. Subsequently, in case that an alignment signal is supplied to the electrodes ALE, the light emitting elements LD may be aligned between the electrodes ALE, while an electric field is formed between the electrodes ALE. After the light emitting elements LD are aligned, the solvent may be volatilized or removed through other processes, so that the light emitting elements LD can be stably arranged between the electrodes ALE.

A second insulating layer INS2 may be disposed on the light emitting elements LD. For example, the second insulating layer INS2 may be partially provided on the light emitting elements LD, and expose first and second end portions EP1 and EP2 of the light emitting elements LD. In case that the second insulating layer INS2 is formed on the light emitting elements LD after the alignment of the light emitting elements LD is completed, the light emitting elements LD can be prevented from being separated from a position at which the light emitting elements LD are aligned.

The second insulating layer INS2 may be configured as a single layer or a multi-layer, and include various kinds of inorganic insulating materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The connection electrodes ELT may be disposed on the first and second end portions EP1 and EP2 of the light emitting elements LD, which are exposed by the second insulating layer INS2. The connection electrodes ELT may be disposed in a same layer. For example, the connection electrodes ELT may be configured as a same conductive layer. The connection electrodes ELT may be simultaneously formed through a same process. The connection electrodes ELT may be separated as individual connection electrodes ELT by forming a conductive layer on the light emitting element LD and partially removing the conductive layer formed on the second insulating layer INS2. However, the disclosure is not limited thereto, and some of the connection electrodes ELT may be formed in different conductive layers.

A first connection electrode ELT1 may be directly disposed on first end portions EP1 of first light emitting elements LD1, to contact the first end portions EP1 of the first light emitting elements LD1.

In addition, a second connection electrode ELT2 may be directly disposed on second end portions EP2 of the first light emitting elements LD1, to contact the second end portions EP2 of the first light emitting elements LD1. Also, the second connection electrode ELT2 may be directly disposed on first end portions of second light emitting elements LD2, to contact the first end portions EP1 of the second light emitting elements LD2. For example, the second connection electrode ELT2 may electrically connect the second end portions EP2 of the first light emitting elements LD1 and the first end portions EP1 of the second light emitting elements LD2 to each other.

Similarly, a third connection electrode ELT3 may be directly disposed on second end portions EP2 of the second light emitting elements LD2, to contact the second end portions EP2 of the second light emitting elements LD2. Also, the third connection electrode ELT3 may be directly disposed on first end portions EP1 of third light emitting elements LD3, to contact the first end portions EP1 of the third light emitting elements LD3. For example, the third connection electrode ELT3 may electrically connect the second end portions EP2 of the second light emitting elements LD2 and the first end portions EP1 of the third light emitting elements LD3 to each other.

Similarly, a fourth connection electrode ELT4 may be directly disposed on second end portions EP2 of the third light emitting elements LD3, to contact the second end portions EP2 of the third light emitting elements LD3. Also, the fourth connection electrode ELT4 may be directly disposed on first end portions EP1 of the fourth light emitting elements LD4, to contact the first end portions EP1 of the fourth light emitting elements LD4. For example, the fourth connection electrode ELT4 may electrically connect the second end portions EP2 of the third light emitting elements LD3 and the first end portions EP1 of the fourth light emitting elements LD4 to each other.

Similarly, a fifth connection electrode ELT5 may be directly disposed on second end portions EP2 of the fourth light emitting elements LD4, to contact the second end portions EP2 of the fourth light emitting elements LD4.

The connection electrodes ELT may be made of various transparent conductive materials. In an example, the connection electrodes ELT may include at least one of various transparent conductive materials including indium tin oxide (ITO), indium zinc oxide (IZO), indium tin zinc oxide (ITZO), zinc oxide (ZnO), aluminum-doped zinc oxide (AZO), gallium-doped zinc oxide (GZO), zinc tin oxide (ZTO), or gallium tin oxide (GTO), and may be implemented substantially transparently or translucently to satisfy a transmittance (e.g., a predetermined or selected transmittance). Accordingly, light emitted from the first and second end portions EP1 and EP2 of the light emitting elements LD can be emitted to the outside of the display panel PNL while passing through the connection electrodes ELT.

Figure 8:
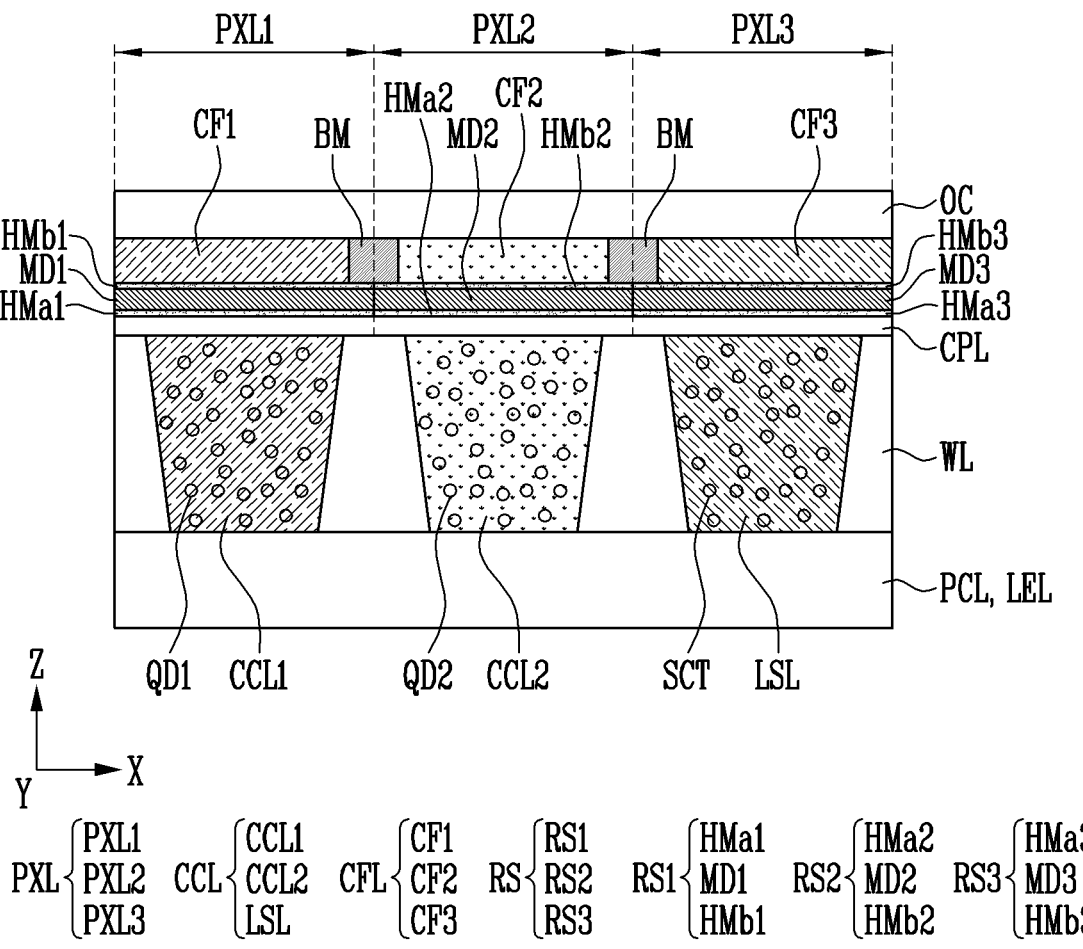
FIG. 8 is a schematic cross-sectional view illustrating first to third pixels in accordance with an embodiment of the disclosure.
Figure 9:
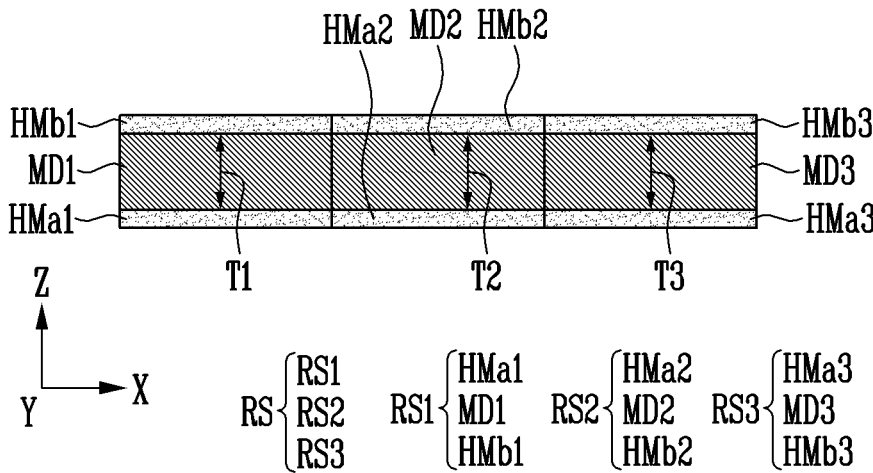
FIGS. 9 to 11 are schematic cross-sectional views illustrating a resonant filter.
Figure 10:
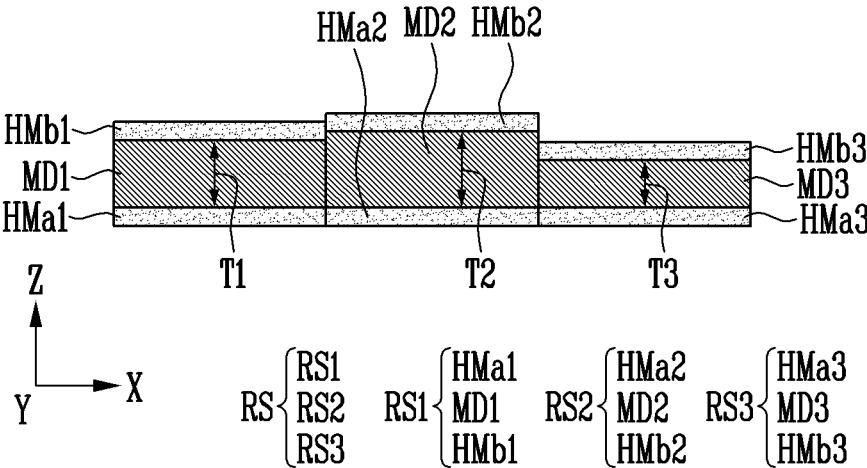
Figure 11:
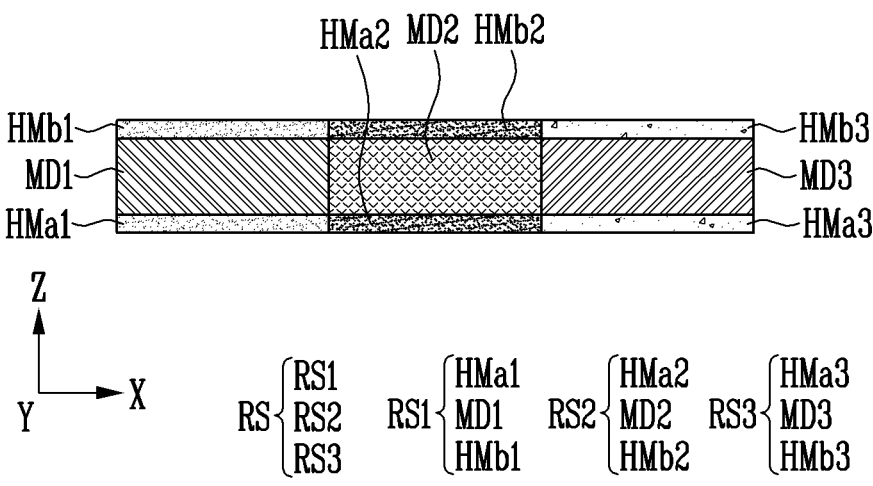

FIG. 8 is a schematic sectional view illustrating first to third pixels in accordance with an embodiment of the disclosure. FIGS. 9 to 11 are schematic sectional views illustrating a resonant filter.

FIG. 8 illustrates a partition wall WL, a color conversion layer CCL, a color filter layer CFL, and/or an overcoat layer OC which are provided on the pixel circuit layer PCL and the light emitting element layer LEL of the pixel PXL described with reference to FIGS. 6 and 7.

Referring to FIG. 8, the partition wall may be disposed on the light emitting element layer LEL of the first to third pixels PXL1, PXL2, and PXL3. In an example, the partition wall WL may be disposed between the first to third pixels PXL1, PXL2, and PXL3 or at a boundary between the first to third pixels PXL1, PXL2, and PXL3, and include an opening overlapping each of the first to third pixels PXL1, PXL2, and PXL3. The opening of the partition wall WL may provide a space in which the color conversion layer CCL can be provided.

The partition wall WL may include an organic material such as acrylic resin, epoxy resin, phenolic resin, polyamide resin, polyimide resin, polyester resin, polyphenylene sulfide resin, or benzocyclobutene (BCB). However, the disclosure is not limited thereto, and the partition wall WL may include various kinds of inorganic insulating materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In some embodiments, the partition wall WL may include at least one light blocking and/or at least one reflective material. Accordingly, light leakage between adjacent pixels PXL can be prevented. For example, the partition wall WL may include at least one black matrix material and/or at least one color filter material. In an example, the partition wall WL may be formed as a black opaque pattern capable of blocking transmission of light. In an embodiment, a reflective layer (not shown) or the like may be formed on a surface (e.g., a sidewall) of the partition wall WL so as to improve the light efficiency of each pixel PXL.

The color conversion layer CCL may be disposed on the light emitting element layer EL including the light emitting elements LD in the opening of the partition wall WL. The color conversion layer CCL may include a first color conversion layer CCL1 disposed in the first pixel PXL1, a second color conversion layer CCL2 disposed in the second pixel PXL2, and a light scattering layer LSL disposed in the third pixel PXL3.

In an embodiment, the first to third pixels PXL1, PXL2, and PXL3 may include light emitting elements LD emitting light of a same color. For example, the first to third pixels PXL1, PXL2, and PXL3 may include light emitting elements LD emitting light of a third color (or blue). The color conversion layer CCL including color conversion particles is disposed on each of the first to third pixels PXL1, PXL2, and PXL3, so that a full-color image can be displayed.

The first color conversion layer CCL1 may include first color conversion particles for converting light of the third color, which is emitted from the light emitting element LD, into light of a first color. For example, the first color conversion layer CCL1 may include first quantum dots QD1 dispersed in a matrix material such as base resin.

In an embodiment, in case that the light emitting element LD is a blue light emitting element emitting light of blue, and the first pixel PXL1 is a red pixel, the first color conversion layer CCL1 may include a first quantum dot QD1 for converting light of blue, which is emitted from the blue light emitting element, into light of red. The first quantum dot QD1 may absorb blue light and emit red light by shifting a wavelength of the blue light according to energy transition. In case that the first pixel PXL1 is a pixel of another color, the first color conversion layer CCL1 may include a first quantum dot QD1 corresponding to the color of the first pixel PXL1.

The second color conversion layer CCL2 may include second color conversion particles for converting light of the third color, which is emitted from the light emitting element LD, into light of a second color. For example, the second color conversion layer CCL2 may include second quantum dots QD2 dispersed in a matrix material such as base resin.

In an embodiment, in case that the light emitting element LD is a blue light emitting element emitting light of blue, and the second pixel PXL2 is a green pixel, the second color conversion layer CCL2 may include a second quantum dot QD2 for converting light of blue, which is emitted from the blue light emitting element, into light of green. The second quantum dot QD2 may absorb blue light and emit green light by shifting a wavelength of the blue light according to energy transition. In case that the second pixel PXL2 is a pixel of another color, the second color conversion layer CCL2 may include a second quantum dot QD2 corresponding to the color of the second pixel PXL2.

In an embodiment, light of blue having a relatively short wavelength in a visible light band is incident into the first quantum dot QD1 and the second quantum dot QD2, so that absorption coefficients of the first quantum dot QD1 and the second quantum dot QD2 can be increased. Accordingly, the efficiency of light finally emitted from the first pixel PXL1 and the second pixel PXL2 can be improved, and excellent color reproduction can be ensured. In addition, the light emitting part EMU of each of the first to third pixels PXL1, PXL2, and PXL3 is configured using light emitting elements of a same color (e.g., blue light emitting elements), so that the manufacturing efficiency of the display device can be improved.

The light scattering layer LSL may be provided to efficiently use light of the third color (or blue) emitted from the light emitting element LD. In an example, in case that the light emitting element LD is a blue light emitting element emitting light of blue, and the third pixel PXL3 is a blue pixel, the light scattering layer LSL may include at least one kind of light scattering particles SCT to efficiently use light emitted from the light emitting element LD.

For example, the light scattering layer LSL may include light scattering particles SCT dispersed in a matrix material such as base resin. In an example, the light scattering layer LSL may include a light scattering particle SCT such as silica, but the material forming the light scattering particles SCT is not limited thereto. The light scattering particles SCT are not disposed in only the third pixel PXL3, and may be selectively included even at the inside of the first color conversion layer CCL1 or the second color conversion layer CCL2. In some embodiments, the light scattering particle SCT may be omitted such that the light scattering layer LSL configured with transparent polymer is provided.

A capping layer CPL may be disposed on the color conversion layer CCL. The capping layer CPL may be provided across the first to third pixels PXL1, PXL2, and PXL3. The capping layer CPL may cover the color conversion layer CCL. The capping layer CPL may prevent the color conversion layer CCL from being damaged or contaminated due to infiltration of an impurity such as moisture or air from the outside.

The capping layer CPL is an inorganic layer, and may include silicon nitride (SiN$_x$), aluminum nitride (AlN$_x$), titanium nitride (TiN$_x$), silicon oxide (SiO$_x$), aluminum oxide (AlO$_x$), titanium oxide (TiO$_x$), silicon oxycarbide (SiO$_x$C$_y$), silicon oxynitride (SiO$_x$N$_y$), and the like.

A resonant filter RS may be disposed on the capping layer CPL. The resonant filter RS may function to allow lights having several wavelengths, which are emitted from the color conversion layer CCL, to be selectively transmitted or reflected therethrough or therefrom by generating a multi-interference phenomenon, so that light efficiency can be improved. In an example, the resonant filter RS may be a Fabry-Perot filter, but the disclosure is not limited thereto.

The resonant filter RS may include a first resonant filter RS1 disposed in the first pixel PXL1, a second resonant filter RS2 disposed in the second pixel PXL2, and a third resonant filter RS3 disposed in the third pixel PXL3. In an embodiment, in case that the light emitting element LD is a blue light emitting element emitting light of blue, and the first pixel PXL1 is a red pixel, light of red in light emitted from the first color conversion layer CCL1 may be relatively transmitted by the first resonant filter RS1, and light of blue in the light emitted from the first color conversion layer CCL1 may be relatively reflected by the first resonant filter RS1 to be recycled to the first color conversion layer CCL1. For example, the first resonant filter RS1 may allow 70% or more of the light of red to be transmitted therethrough, and allow 20% or less of the light of blue to be transmitted therethrough. Also, the first resonant filter RS1 may allow 10% or less of the light of red to be reflected therefrom, and allow 60% or more of the light of blue to be reflected therefrom. However, the disclosure is not limited thereto.

In case that the light emitting element LD is a blue light emitting element emitting light of blue, and the second pixel PXL2 is a green pixel, light of green in light emitted from the second color conversion layer CCL2 may be relatively transmitted by the second resonant filter RS2, and light of blue in the light emitted from the second color conversion layer CCL2 may be relatively reflected by the second resonant filter RS2 to be recycled to the second color conversion layer CCL2. For example, the second resonant filter RS2 may allow 70% or more of the light of green to be transmitted therethrough, and allow 20% or less of the light of blue to be transmitted therethrough. Also, the second resonant filter RS2 may allow 10% or less of the light of green to be reflected therefrom, and allow 60% or more of the light of blue to be reflected therefrom. However, the disclosure is not limited thereto. As described above, the light of blue is selectively reflected to be recycled in the first pixel PXL1 and the second pixel PXL2, so that the efficiency of the color conversion layer CCL can be improved.

In case that the light emitting element LD is a blue light emitting element emitting light of blue, and the third pixel PXL3 is a blue pixel, light emitted from the light scattering layer LSL may be transmitted by the third resonant filter RS3.

The first resonant filter RS1 may include a first semi-transmissive layer HMa1, a second semi-transmissive layer HMb1, and a medium MD1 disposed between the first semi-transmissive layer HMa1 and the second semi-transmissive layer HMb1. The second resonant filter RS2 may include a first semi-transmissive layer HMa2, a second semi-transmissive layer HMb2, and a medium MD2 disposed between the first semi-transmissive layer HMa2 and the second semi-transmissive layer HMb2. The third reso-
nant filter RS3 may include a first semi-transmissive layer
HMa3, a second semi-transmissive layer HMb3, and a
medium MD3 disposed between the first semi-transmissive
layer HMa3 and the second semi-transmissive layer HMb3.

Each of the media MD1, MD2, and MD3 of the first to
third resonant filters RS1, RS2, and RS3 may include an
organic material such as acrylic resin, epoxy resin, phenolic
resin, polyamides resin, polyimides resin, polyester resin,
polyphenylene sulfide resin, or benzocyclobutene (BCB).
Alternatively, each of the media MD1, MD2, and MD3 of
the first to third resonant filters RS1, RS2, and RS3 may
include various kinds of inorganic insulating materials
including silicon oxide ($SiO_x$), silicon nitride ($SiN_x$), silicon
oxynitride ($SiO_xN_y$), aluminum nitride ($AlN_x$), aluminum
oxide ($AlO_x$), zirconium oxide ($ZrO_x$), hafnium oxide
($HfO_x$), and titanium oxide ($TiO_x$). Each of the media MD1,
MD2, and MD3 of the first to third resonant filters RS1, RS2,
and RS3 may include a transparent metal or a transparent
metal oxide. In an example, each of the media MD1, MD2,
and MD3 of the first to third resonant filters RS1, RS2, and
RS3 may include at least one of indium tin oxide (ITO),
indium zinc oxide (IZO), and zinc tin oxide (ZTO), but the
disclosure is not limited thereto.

Each of the media MD1, MD2, and MD3 of the first to
third resonant filters RS1, RS2, and RS3 may have a
refractive index of about 2.5 or less. However, the disclosure
is not limited thereto, and the refractive index of each of the
media MD1, MD2, and MD3 of the first to third resonant
filters RS1, RS2, and RS3 may be variously changed by
considering a transmittance and/or a reflexibility of the
resonant filter RS and/or a spectrum of light emitted from the
color conversion layer CCL.

Each of the media MD1, MD2, and MD3 of the first to
third resonant filters RS1, RS2, and RS3 may be formed to
have a thickness of about 1 μm or less. However, the
disclosure is not limited thereto, and the thickness T1, T2, or
T3 of each of the media MD1, MD2, and MD3 of the first
to third resonant filters RS1, RS2, and RS3 may be variously
changed by considering a transmittance and/or a reflexibility
of the resonant filter RS and/or a spectrum of light emitted
from the color conversion layer CCL.

Referring to FIG. 9, a thickness T1 of the medium MD1
of the first resonant filter RS1 in the third direction (Z-axis
direction), a thickness T2 of the medium MD2 of the second
resonant filter RS2 in the third direction (Z-axis direction),
and a thickness T3 of the medium MD3 of the third resonant
filter RS3 in the third direction (Z-axis direction) may be the
same. For example, thicknesses of the first to third resonant
filters RS1, RS2, and RS3 in the third direction (Z-axis
direction) may be the same. As described above, in case that
the thicknesses T1, T2, and T3 of the media MD1, MD2, and
MD3 of the first to third resonant filters RS1, RS2, and RS3
are formed equal to one another, fairness can be ensured.

Referring to FIG. 10, a thickness T1 of the medium MD1
of the first resonant filter RS1 in the third direction (Z-axis
direction), a thickness T2 of the medium MD2 of the second
resonant filter RS2 in the third direction (Z-axis direction),
and a thickness T3 of the medium MD3 of the third resonant
filter RS3 in the third direction (Z-axis direction) may be
different from each other. For example, thicknesses of the
first to third resonant filters RS1, RS2, and RS3 in the third
direction (Z-axis direction) may be different from each other.
Although FIG. 10 illustrates as an example a case where the
thickness T1 of the medium MD1 of the first resonant filter
RS1 in the third direction (Z-axis direction) is greater than
the thickness T3 of the medium MD3 of the third resonant filter RS3 in the third direction (Z-axis direction) and the
thickness T2 of the medium MD2 of the second resonant
filter RS2 in the third direction (Z-axis direction) is greater
than the thickness T1 of the medium MD1 of the first
resonant filter RS1 in the third direction (Z-axis direction),
the disclosure is not limited thereto.

Each of the first semi-transmissive layers HMa1, HMa2,
and HMa3 and/or the second semi-transmissive layers
HMb1, HMb2, and HMb3 of the first to third resonant filters
RS1, RS2, and RS3 may be a half mirror. Each of the first
semi-transmissive layers HMa1, HMa2, and HMa3 and/or
the second semi-transmissive layers HMb1, HMb2, and
HMb3 of the first to third resonant filters RS1, RS2, and RS3
may be a metal thin film having a thickness of about 30 nm
or less. In an example, each of the first semi-transmissive
layers HMa1, HMa2, and HMa3 and/or the second semi-
transmissive layers HMb1, HMb2, and HMb3 of the first to
third resonant filters RS1, RS2, and RS3 may be formed as
a single layer or a multi-layer, which is made of at least one
of molybdenum (Mo), copper (Cu), aluminum (Al), chro-
mium (Cr), gold (Au), silver (Ag), platinum (Pt), iron (Fe),
titanium (Ti), nickel (Ni), neodymium (Nd), indium (In), tin
(Sn), and any oxide or ally thereof, but the disclosure is not
limited thereto.

As shown in FIGS. 9 and 10, the semi-transmissive layers
HMa1 and HMb1 of the first resonant filter RS1, the
semi-transmissive layers HMa2 and HMb2 of the second
resonant filter RS2, and the semi-transmissive layers HMa3
and HMb3 of the third resonant filter RS3 may be formed of
a same material. In addition, the medium MD1 of the first
resonant filter RS1, the medium MD2 of the second resonant
filter RS2, and the medium MD3 of the third resonant filter
RS3 may be formed of a same material. As described above,
in case that each of the semi-transmissive layers HMa1,
HMa2, HMa3, HMb1, HMb2, and HMb3 and the media
MD1, MD2, and MD3 of the first to third resonant filters
RS1, RS2, and RS3 are formed of a same material, the
fairness can be ensured. However, the disclosure is not
limited thereto. As shown in FIG. 11, each of the semi-
transmissive layers HMa1 and HMb1 and/or the medium
MD1 of the first resonant filter RS1, the semi-transmissive
layers HMa2 and HMb2 and/or the medium MD2 of the
second resonant filter RS2, and the semi-transmissive layers
HMa3 and HMb3 and/or the medium MD3 of the third
resonant filter RS3 may be formed of different materials.

The color filter layer CFL may be disposed on the
resonant filter RS. The color filter layer CFL may be
disposed directly on the resonant filter RS, but the disclosure
is not limited thereto. The color filter layer CFL may include
color filters CF1, CF2, and CF3 which accord with a color
of each pixel PXL. The color filters CF1, CF2, and CF3
which accord with a color of each of the first to third pixels
PXL1, PXL2, and PXL3 are disposed, so that a full-color
image can be displayed.

The color filter layer CFL may include a first color filter
CF1 disposed in the first pixel PXL1 to allow light emitted
from the first pixel PXL1 to be selectively transmitted
therethrough, a second color filter CF2 disposed in the
second pixel PXL2 to allow light emitted from the second
pixel PXL2 to be selectively transmitted therethrough, and
a third color filter CF3 disposed in the third pixel PXL3 to
allow light emitted from the third pixel PXL3 to be selec-
tively transmitted therethrough.

In an embodiment, the first color filter CF1, the second
color filter CF2, and the third color filter CF3 may be
respectively a red color filter, a green color filter, and a blue
color filter, but the disclosure is not limited thereto. Hereinafter, in case that an arbitrary color filter among the first color filter CF1, the second color filter CF2, and the third color filter CF3 is designated or in case that two or more kinds of color filters are inclusively designated, the corresponding color filter or the corresponding color filters are referred to as a "color filter CF" or "color filters CF."

The first color filter CF1 may overlap the light emitting element layer LEL (or the light emitting element LD), the first color conversion layer CCL, and/or the first resonant filter RS1 of the first pixel PXL1 in the third direction (Z-axis direction). The first color filter CF1 may include a color filter material for allowing light of a first color (or red) to be selectively transmitted therethrough. For example, in case that the first pixel PXL1 is a red pixel, the first color filter CF1 may include a red color filter material.

The second color filter CF2 may overlap the light emitting element layer LEL (or the light emitting element LD), the second color conversion layer CCL, and/or the second resonant filter RS2 of the second pixel PXL2 in the third direction (Z-axis direction). The second color filter CF2 may include a color filter material for allowing light of a second color (or green) to be selectively transmitted therethrough. For example, in case that the second pixel PXL2 is a green pixel, the second color filter CF2 may include a green color filter material.

The third color filter CF3 may overlap the light emitting element layer LEL (or the light emitting element LD), the light scattering layer LSL, and/or the third resonant filter RS3 of the third pixel PXL3 in the third direction (Z-axis direction). The third color filter CF3 may include a color filter material for allowing light of a third color (or blue) to be selectively transmitted therethrough. For example, in case that the third pixel PXL3 is a blue pixel, the third color filter CF3 may include a blue color filter material.

In some embodiments, a light blocking layer BM may be further disposed between the first to third color filters CF1, CF2, and CF3 or at a boundary between the first to third color filters CF1, CF2, and CF3. As described above, in case that the light blocking layer BM is formed between the first to third color filters CF1, CF2, and CF3, a color mixture defect viewed at the front or side of the display device can be prevented. The material of the light blocking layer BM is not particularly limited, and the light blocking layer BM may be configured with various light blocking materials. In an example, the light blocking layer BM may be implemented by stacking the first to third color filters CF1, CF2, and CF3.

The overcoat layer OC may be disposed on the color filter layer CFL. The overcoat layer OC may be provided throughout or across the first to third pixels PXL1, PXL2, and PXL3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

The overcoat layer OC may include an organic material such as acrylic resin, epoxy resin, phenolic resin, polyamide resin, polyimide resin, polyester resin, polyphenylene sulfide resin, or benzocyclobutene (BCB). However, the disclosure is not limited thereto, and the overcoat layer OC may include various kinds of inorganic insulating materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In accordance with the above-described embodiment, the resonant filter RS capable of allowing light having a specific wavelength to be selectively transmitted or reflected therethrough or therefrom is disposed between the color conversion layer CCL and the color filter layer CPL, so that light efficiency and luminance can be improved.

Hereinafter, an embodiment will be described. In the following embodiment, components identical to those which have already described are designated by like reference numerals, and repetitive descriptions will be omitted or simplified.

Figure 12:
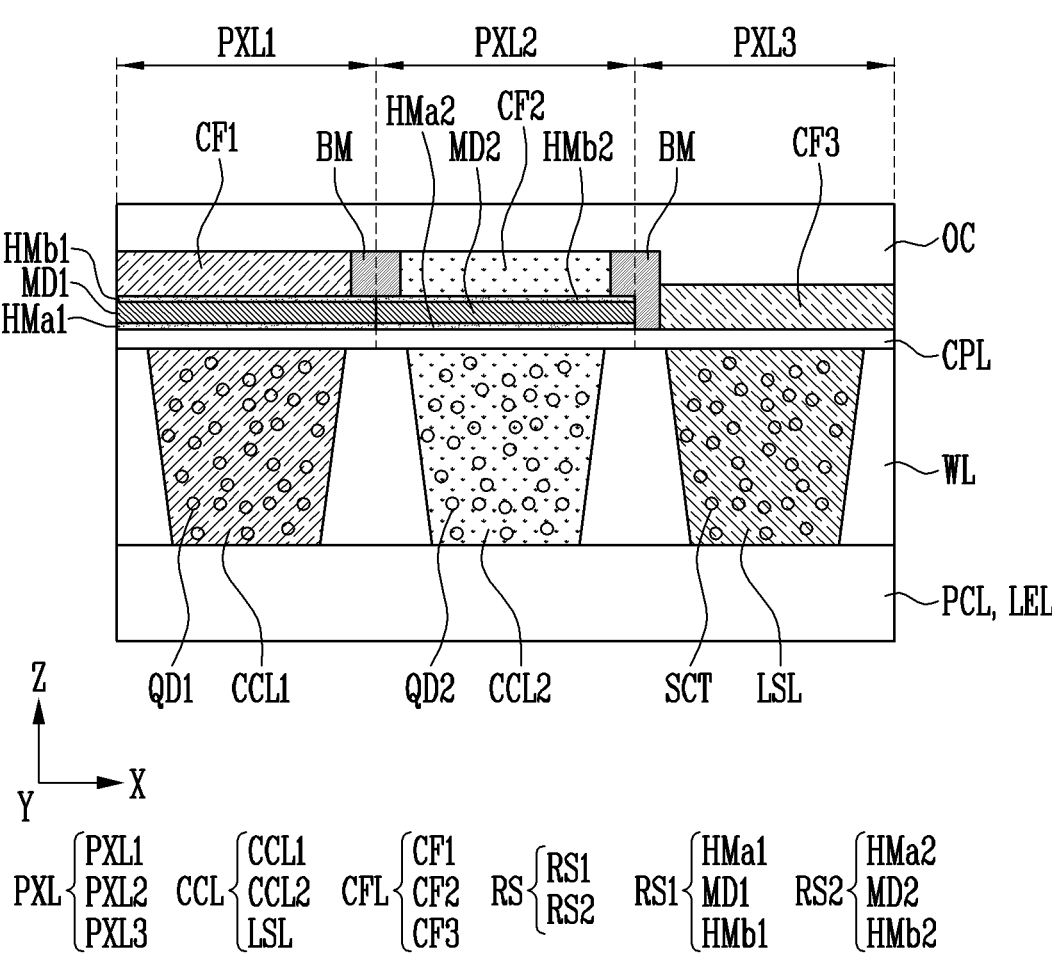
FIG. 12 is a schematic cross-sectional view illustrating first to third pixels in accordance with an embodiment of the disclosure.
Figure 13:
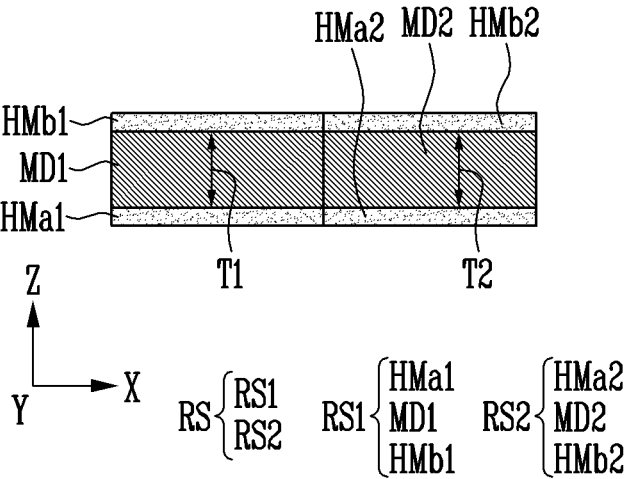
FIGS. 13 to 15 are sectional views illustrating a resonant filter.
Figure 14:
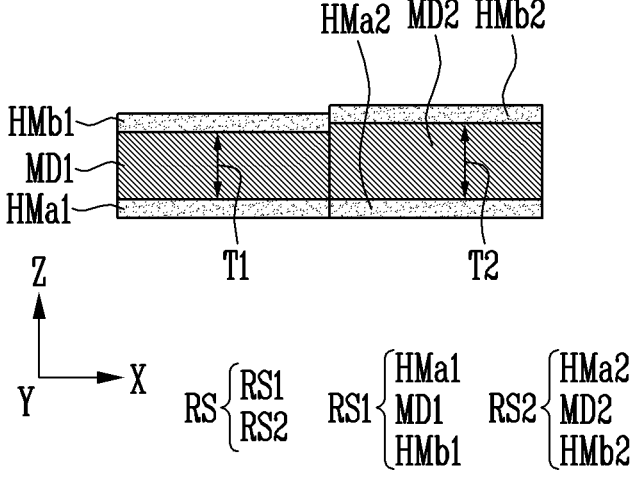
Figure 15:
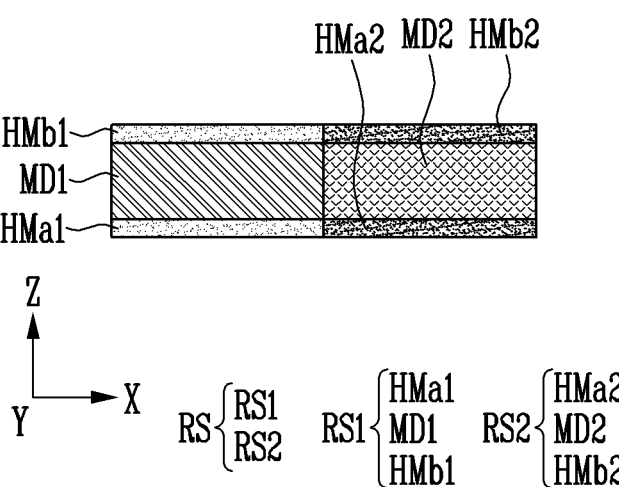

FIG. 12 is a schematic sectional view illustrating first to third pixels in accordance with an embodiment of the disclosure. FIGS. 13 to 15 are schematic sectional views illustrating a resonant filter.

Referring to FIG. 12, a resonant filter RS may include a first resonant filter RS1 disposed in the first pixel PXL1 and a second resonant filter RS2 disposed in the second pixel PXL1. The first resonant filter RS1 and/or the second resonant filter RS2 may not overlap the third pixel PXL3.

In case that the light emitting element LD is a blue light emitting element emitting light of blue, and the first pixel PXL1 is a red pixel, light of red in light emitted from the first color conversion layer CCL1 may be relatively transmitted by the first resonant filter RS1, and light of blue in the light emitted from the first color conversion layer CCL1 may be relatively reflected by the first resonant filter RS1 to be recycled to the first color conversion layer CCL1.

In case that the light emitting element LD is a blue light emitting element emitting light of blue, and the second pixel PXL2 is a green pixel, light of green in light emitted from the second color conversion layer CCL2 may be relatively transmitted by the second resonant filter RS2, and light of blue in the light emitted from the second color conversion layer CCL2 may be relatively reflected by the second resonant filter RS2 to be recycled to the second color conversion layer CCL2.

In case that the light emitting element LD is a blue light emitting element emitting light of blue, and the third pixel PXL3 is a blue pixel, the resonant filter RS may be omitted in the third pixel PXL3, so that light of blue, which is emitted from the light scattering layer LSL, can be incident directly onto the third color filter CF3.

Referring to FIG. 13, a thickness T1 of a medium MD1 of the first resonant filter RS1 in the third direction (Z-axis direction) and a thickness T2 of a medium MD2 of the second resonant filter RS2 in the third direction (Z-axis direction) may be the same. For example, thicknesses of the first resonant filter RS1 and the second resonant filter RS2 in the third direction (Z-axis direction) may be the same. As described above, in case that the thicknesses T1 and T2 of the media MD1 and MD2 of the first and second resonant filters RS1 and RS2 are formed equal to each other, fairness can be ensured.

Referring to FIG. 14, a thickness T1 of a medium MD1 of the first resonant filter RS1 in the third direction (Z-axis direction) and a thickness T2 of a medium MD2 of the second resonant filter RS2 in the third direction (Z-axis direction) may be different from each other. For example, thicknesses of the first resonant filter RS1 and the second resonant filter RS2 in the third direction (Z-axis direction) may be different from each other. Although FIG. 14 illustrates as an example a case where the thickness T2 of a medium MD2 of the second resonant filter RS2 in the third direction (Z-axis direction) is greater than the thickness T1 of a medium MD1 of the first resonant filter RS1 in the third direction (Z-axis direction), the disclosure is not limited thereto.

As shown in FIGS. 13 and 14, semi-transmissive layers HMa1 and HMb1 of the first resonant filter RS1 and semi-transmissive layers HMa2 and HMb2 of the second resonant filter RS2 may be formed of a same material. In addition, the medium MD1 of the first resonant filter RS and the medium MD2 of the second resonant filter RS2 may be formed of a same material. As described above, in case that each of the semi-transmissive layers HMa1, HMa2, HMb1, and HMb2 and the media MD1 and MD2 of the first and second resonant filters RS1 and RS2 are formed of a same material, the fairness can be ensured. However, the disclosure is not limited thereto. As shown in FIG. 15, each of semi-transmissive layers HMa1 and HMb1 and/or a medium MD1 of the first resonant filter RS1 and semi-transmissive layers HMa2 and HMb2 and/or a medium MD2 of the second resonant filter RS2 may be formed of different materials.

In accordance with the disclosure, a resonant filter capable of allowing light having a specific wavelength to be selectively transmitted or reflected therethrough or therefrom is disposed between a color conversion layer and a color filter layer, so that light efficiency and luminance can be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
light emitting elements disposed in pixels;
a color conversion layer disposed on the light emitting elements;
a color filter layer disposed on the color conversion layer; and
a resonant filter disposed between the color conversion layer and the color filter layer,
wherein the resonant filter includes:
a first semi-transmissive layer;
a second semi-transmissive layer; and
a medium disposed between the first semi-transmissive layer and the second semi-transmissive layer.

2. The display device of claim 1, wherein
the pixels include a first pixel, a second pixel, and a third pixel, and
the resonant filter includes:
a first resonant filter disposed in the first pixel; and
a second resonant filter disposed in the second pixel.

3. The display device of claim 2, wherein at least one of the first resonant filter or the second resonant filter does not overlap the third pixel in a plan view.

4. The display device of claim 2, wherein the resonant filter further includes a third resonant filter overlapping the third pixel in a plan view.

5. The display device of claim 2, wherein a thickness of a medium of the first resonant filter is different from a thickness of a medium of the second resonant filter.

6. The display device of claim 2, wherein a thickness of a medium of the first resonant filter is equal to a thickness of a medium of the second resonant filter.

7. The display device of claim 6, wherein
the pixels include:
a first pixel emitting light of a first color;
a second pixel emitting light of a second color; and
a third pixel emitting light of a third color, and
the resonant filter allows the lights of the first to third colors to be selectively reflected therefrom or transmitted therethrough.

8. The display device of claim 7, wherein the resonant filter allows about 70% or more of the light of the first color and/or the light of the second color to be transmitted therethrough, and allows about 20% or less of the light of the third color to be transmitted therethrough.

9. The display device of claim 7, wherein the resonant filter allows about 10% or less of the light of the first color and/or the light of the second color to be reflected therefrom, and allows about 60% or more of the light of the third color to be reflected therefrom.

10. The display device of claim 9, wherein the medium of the resonant filter has a refractive index of about 2.5 or less.

11. The display device of claim 9, wherein at least one of the first semi-transmissive layer or the second semi-transmissive layer is a metal thin film.

12. A display device comprising:
first to third pixels respectively emitting light of first to third colors;
light emitting elements disposed in the first to third pixels;
a color conversion layer disposed on the light emitting elements;
a color filter layer disposed on the color conversion layer;
a first resonant filter disposed in the first pixel between the color conversion layer and the color filter layer, and contacting the color filter layer; and
a second resonant filter disposed in the second pixel between the color conversion layer and the color filter layer.

13. The display device of claim 12, wherein at least one of the first resonant filter or the second resonant filter allows the lights of the first to second colors to be selectively reflected therefrom or transmitted therethrough.

14. The display device of claim 12, wherein the first resonant filter and/or the second resonant filter do/does not overlap the third pixel in a plan view.

15. The display device of claim 12, further comprising:
a third resonant filter disposed in the third pixel between the color conversion layer and the color filter layer.

16. The display device of claim 12, wherein a thickness of the first resonant filter is different from a thickness of the second resonant filter.

17. The display device of claim 12, wherein a thickness of the first resonant filter is equal to a thickness of the second resonant filter.

18. The display device of claim 12, wherein the color conversion layer includes:
a first color conversion layer disposed in the first pixel;
a second color conversion layer disposed in the second pixel; and
a light scattering layer disposed in the third pixel.

19. The display device of claim 12, wherein the light emitting elements emit the light of the third color.

20. The display device of claim 12, wherein each of the light emitting elements includes a first semiconductor layer, a second semiconductor layer, and an active layer disposed between the first semiconductor layer and the second semiconductor layer.

* * * * *